(12) United States Patent
Sato et al.

(10) Patent No.: US 9,960,280 B2
(45) Date of Patent: May 1, 2018

(54) SEMICONDUCTOR DEVICE

(71) Applicant: Semiconductor Energy Laboratory Co., Ltd., Atsugi-shi, Kanagawa-ken (JP)

(72) Inventors: Yuichi Sato, Kanagawa (JP); Naoto Yamade, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 23 days.

(21) Appl. No.: 14/574,904

(22) Filed: Dec. 18, 2014

(65) Prior Publication Data

US 2015/0187950 A1    Jul. 2, 2015

(30) Foreign Application Priority Data

Dec. 26, 2013    (JP) ................. 2013-269698

(51) Int. Cl.
*H01L 29/10*    (2006.01)
*H01L 29/786*    (2006.01)
*H01L 27/12*    (2006.01)

(52) U.S. Cl.
CPC ...... *H01L 29/7869* (2013.01); *H01L 27/1225* (2013.01); *H01L 27/1248* (2013.01); *H01L 29/78603* (2013.01)

(58) Field of Classification Search
CPC ..... H01L 51/0072; H01L 51/56; H01L 33/62; H01L 51/5012; C09K 11/06
USPC .......................................................... 257/43
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Andy Huynh
(74) *Attorney, Agent, or Firm* — Fish & Richardson P.C.

(57) ABSTRACT

A transistor with stable electric characteristics is provided. An aluminum oxide film containing boron is formed in order to prevent hydrogen from diffusing into an oxide semiconductor film.

16 Claims, 17 Drawing Sheets

(56) References Cited

U.S. PATENT DOCUMENTS

| | | |
|---|---|---|
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,158,975 B2 | 4/2012 | Akimoto |
| 8,313,980 B2 | 11/2012 | Akimoto |
| 8,502,216 B2 | 8/2013 | Akimoto et al. |
| 8,541,780 B2 | 9/2013 | Yamazaki et al. |
| 8,547,771 B2 | 10/2013 | Koyama |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0248432 A1* | 10/2012 | Noda ............... H01L 21/02472 257/43 |
| 2012/0273773 A1* | 11/2012 | Ieda ..................... H01L 27/105 257/43 |
| 2012/0315730 A1 | 12/2012 | Koezuka et al. |
| 2012/0315735 A1 | 12/2012 | Koezuka et al. |
| 2013/0228782 A1 | 9/2013 | Yamazaki et al. |
| 2013/0299824 A1 | 11/2013 | Akimoto et al. |
| 2014/0087517 A1 | 3/2014 | Akimoto et al. |
| 2014/0097867 A1 | 4/2014 | Koyama |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-257187 A | 12/2012 |
| JP | 2013-149982 A | 8/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul 1, 1995, vol. 42, NO. 7, pp. 1240-1246.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec, 5, 2005, pp. 1067-1069.

(56) References Cited

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", AM-FPD '09 Digest of Technical Papers, Jul. 1, 2009, pp. 41-44.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phase for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—Bo Systems [A: Fe, Ga, or Al; B: Mg, Mn, Fe, Ni, Cu,or ZN] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06: Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07: SID International Symposium Digest of Technical Papers, 2007, vol. 38, pp. 1673-1676.

Mo.Y et al., "Amorphous Oxide TFT Backplanes for Large Size AMOLED Displays", IDW '08: Proceedings of the 6th International Display Workshops, Dec. 3, 2008, pp. 581-584.

Nakamura.M et al., "The phase relations in the In2O3—Ga2ZnO4—ZnO system at 1350°C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol.85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semicondutor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review B), 2008, vol. 77, pp. 245202-1-245202-6.

Oh.M et al., "Improving the Gate Stability of ZnO Thin-Film Transistors With Aluminum Oxide Dielectric Layers", J.

(56) References Cited

OTHER PUBLICATIONS

Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09: SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09: SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Lettrs), Jun. 26, 2007, vol. 90, No. 26, pp. 262106-1-262106-3.

Park.S et al., "Challenge to Future Displays: Transparent AM-OLED Driven by PEALD Grown ZnO TFT", IMD '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs ", IDW '02: Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

SEMICONDUCTOR DEVICE

BACKGROUND OF THE INVENTION

1. Field of the Invention

The present invention relates to, for example, a semiconductor layer, a semiconductor device, a display device, a light-emitting device, a memory device, or a processor. The present invention relates to a method for manufacturing a semiconductor film, a semiconductor device, a display device, a light-emitting device, a memory device, or a processor. The present invention relates to a method for driving a semiconductor device, a display device, a light-emitting device, a memory device, or a processor.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor layer over a substrate having an insulating surface has attracted attention. The transistor is applied to a wide range of semiconductor devices such as an integrated circuit and a display device. A silicon layer is known as a semiconductor layer applicable to a transistor.

Whether an amorphous silicon layer or a polycrystalline silicon layer is used as a semiconductor layer in a transistor depends on the purpose. For example, in the case of a transistor included in a large display device, an amorphous silicon layer, which can be formed using an established technique for forming a film over a large substrate, is preferably used. On the other hand, in the case of a transistor included in a high-performance display device where driver circuits are formed over the same substrate, a polycrystalline silicon layer, which can form a transistor having a high field-effect mobility, is preferably used. As a method for forming a polycrystalline silicon layer, high-temperature heat treatment or laser light treatment which is performed on an amorphous silicon layer has been known.

In recent years, an oxide semiconductor layer has attracted attention. An oxide semiconductor layer can be formed by a sputtering method or the like, and thus can be used for a semiconductor layer of a transistor in a large display device. A transistor including an oxide semiconductor layer has a high field-effect mobility; therefore, a high-performance display device where driver circuits are formed over the same substrate can be obtained. Moreover, there is an advantage that capital investment can be reduced because part of production equipment for a transistor including an amorphous silicon layer can be retrofitted and utilized.

A transistor including an oxide semiconductor film is known to have extremely small leakage current in an off state. For example, a CPU with low power consumption utilizing the low leakage current of the transistor including an oxide semiconductor film is disclosed (see Patent Document 1).

REFERENCE

Patent Document

[Patent Document 1] Japanese Published Patent Application No. 2012-257187

SUMMARY OF THE INVENTION

An object is to provide a transistor having large on-state current (current in an on state). Another object is to provide a transistor having small off-state current (current in an off state). Another object is to provide a transistor having stable electric characteristics. Another object is to provide a semiconductor device including the transistor. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including an aluminum oxide film containing boron and an oxide semiconductor film.

One embodiment of the present invention is a semiconductor device including an aluminum oxide film containing boron and an oxide semiconductor film over the aluminum oxide film containing boron.

One embodiment of the present invention is a semiconductor device including an oxide semiconductor film and an aluminum oxide film containing boron over the oxide semiconductor film.

One embodiment of the present invention is a semiconductor device including a first aluminum oxide film containing boron, an oxide semiconductor film over the first aluminum oxide film containing boron, and a second aluminum oxide film containing boron over the oxide semiconductor film.

In any of the above embodiments, the oxide semiconductor film is in contact with the first aluminum oxide film containing boron and the second aluminum oxide film containing boron.

In any of the above embodiments, an oxygen-excess insulating layer in contact with the oxide semiconductor film is included.

In any of the above embodiments, an oxygen-excess insulating layer in contact with the oxide semiconductor film is included.

In any of the above embodiments, the aluminum oxide film containing boron includes a region having a thickness greater than or equal to 30 nm and less than or equal to 50 nm.

In any of the above embodiments, a maximum concentration of boron in the aluminum oxide film containing boron is higher than or equal to $5.0 \times 10^{20}$ atoms/cm$^3$, preferably higher than or equal to $1.0 \times 10^{21}$ atoms/cm$^3$ and lower than or equal to $1.0 \times 10^{22}$ atoms/cm$^3$.

In any of the above embodiments, at least one of the first and second aluminum oxide films containing boron includes a region having a thickness greater than or equal to 30 nm and less than or equal to 50 nm.

In any of the above embodiments, a maximum concentration of boron in at least one of the first and second aluminum oxide films containing boron is higher than or equal to $5.0\times10^{20}$ atoms/cm$^3$, preferably higher than or equal to $1.0\times10^{21}$ atoms/cm$^3$ and lower than or equal to $1.0\times10^{22}$ atoms/cm$^3$.

Note that the oxide semiconductor film in any of the semiconductor devices of the embodiments of the present invention may be replaced with a layer of another semiconductor.

A transistor having large on-state current (current in an off state) can be provided. A transistor having small off-state current (current in an off state) can be provided. A transistor having stable electric characteristics can be provided. A semiconductor device including the transistor can be provided. A robust semiconductor device can be provided. A novel semiconductor device can be provided.

Note that the descriptions of these effects do not disturb the existence of other effects. One embodiment of the present invention does not necessarily have all the effect listed above. Other effects will be apparent from and can be derived from the description of the specification, the drawings, the claims, and the like.

DETAILED DESCRIPTION OF THE INVENTION

Figure 1A:
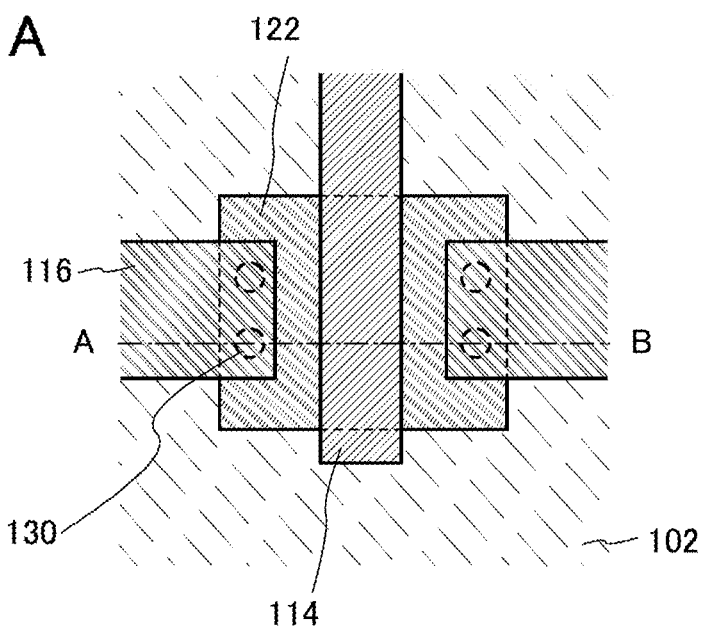
FIGS. 1A and 1B are a top view and a cross-sectional view illustrating a transistor of one embodiment of the present invention.

Hereinafter, embodiments of the present invention will be described in detail with reference to the drawings. However, the present invention is not limited to the description below, and it is easily understood by those skilled in the art that modes and details can be modified in various ways. Further, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings are sometimes exaggerated for simplicity.

A voltage usually refers to a potential difference between a given potential and a reference potential (e.g., a source potential or a ground potential (GND)). Accordingly, a voltage can also be called a potential.

Note that the ordinal numbers such as "first" and "second" in this specification are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that a "semiconductor" may have characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that an impurity in a semiconductor layer refers to, for example, elements other than the main components of the semiconductor layer. For example, an element with a concentration lower than 0.1 atomic % is an impurity. When an impurity is contained, density of states (DOS) may be formed in the semiconductor layer, the carrier mobility may be decreased, or the crystallinity may be lowered, for example. In the case where the semiconductor layer is an oxide semiconductor layer, examples of an impurity which changes characteristics of the semiconductor layer include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. When the semiconductor layer is an oxide semiconductor layer, oxygen vacancies might be formed by entry of impurities such as hydrogen, for example.

The structures of transistors of embodiments of the present invention will be described below.

(Embodiment 1)

In this embodiment, an example of a top-gate transistor is described.

Figure 1B:
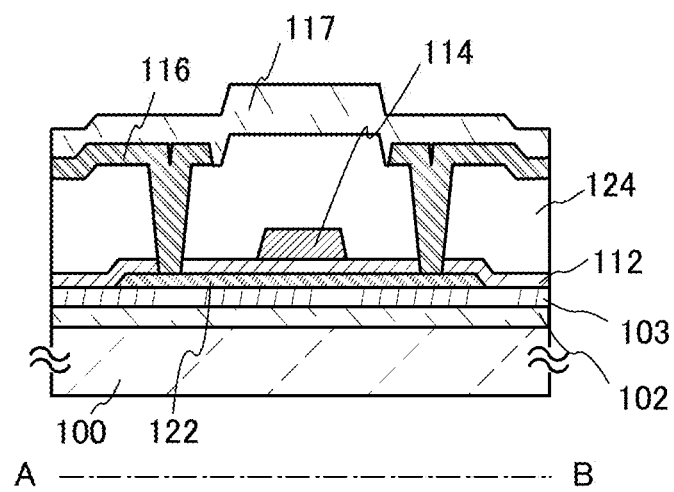

FIGS. 1A and 1B are a top view and a cross-sectional view of a top-gate transistor. FIG. 1A is a top view and FIG. 1B is a cross-sectional view taken along line A-B in FIG. 1A. Note that in FIG. 1A, some components of a transistor (e.g., a gate insulating film 112 and an interlayer insulating film 124) are omitted for simplicity.

The transistor illustrated in FIGS. 1A and 1B includes a substrate 100; a first aluminum oxide film 102 containing boron over the substrate 100; an oxygen-excess insulating layer 103 over the first aluminum oxide film 102 containing boron; an oxide semiconductor film 122 in contact with the oxygen-excess insulating layer 103; the gate insulating film 112 over the oxide semiconductor film 122; a gate electrode 114 over the gate insulating film 112; the interlayer insulating film 124 covering the gate insulating film 112 and the gate electrode 114; wirings 116 connected to the oxide semiconductor film 122 through contact holes 130 provided in the interlayer insulating film 124; and a second aluminum oxide film 117 containing boron and covering the wirings 116.

There is no particular limitation on a substrate that can be used as the substrate 100 as long as it has at least heat resistance to withstand later heat treatment. For example, a glass substrate made of barium borosilicate glass, aluminoborosilicate glass, or the like can be used.

In the case where the temperature of heat treatment to be performed later is high, a glass substrate whose strain point is 730° C. or higher is preferably used. For the glass substrate, a glass material such as aluminosilicate glass, aluminoborosilicate glass, or barium borosilicate glass is used, for example. By containing a larger amount of barium oxide (BaO) than boron oxide, a more practical heat-resistant glass substrate is obtained. Therefore, a glass substrate containing a larger amount of BaO than $B_2O_3$ is preferably used.

Note that instead of the above glass substrate, a substrate formed using an insulator such as a ceramic substrate, a quartz substrate, a sapphire substrate, or the like may be used. Alternatively, crystallized glass or the like may be used.

For example, in this specification and the like, a transistor can be formed using any of a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of the glass substrate, a barium borosilicate glass substrate, an aluminoborosilicate glass substrate, a soda lime glass substrate, or the like can be given. Examples of the flexible substrate, the attachment film, and the base material film are plastics typified by polyethylene terephthalate (PET), polyethylene naphthalate (PEN), and polyether sulfone (PES), a synthetic resin of acrylic or the like, polypropylene, polyester, polyvinyl fluoride, polyvinyl chloride, polyamide, polyimide, aramid, epoxy, an inorganic vapor deposition film, paper, and the like. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above substrate over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability or high heat resistance can be provided, or reduction in weight or thickness can be achieved.

The first aluminum oxide film 102 containing boron over the substrate 100 and the second aluminum oxide film 117 containing boron and covering the wirings 116 are formed in order to prevent hydrogen from diffusing into the oxide semiconductor film 122. Note that it is not necessary to provide both the first aluminum oxide film 102 containing boron and the second aluminum oxide film 117 containing boron, and one of the first and second aluminum oxide films containing boron may be omitted.

In this embodiment, for the first aluminum oxide film 102 containing boron, a 50-nm-thick aluminum oxide film is formed by a sputtering method using an aluminum oxide target under the following conditions: an argon (Ar) gas at a flow rate of 25 sccm and an oxygen ($O_2$) gas at a flow rate of 25 sccm are used as deposition gases; the pressure is 0.4 Pa; the substrate temperature is 250° C.; the distance between the target and the substrate is 60 mm; and an RF power of 2.5 kW is applied. Then, boron ions are implanted into the aluminum oxide film with an acceleration voltage of 7 keV and a dose of $1 \times 10^{16}$ ions/cm². Thus, the first aluminum oxide film 102 containing boron can be formed.

Other than the method for implanting boron ions into an aluminum oxide film after film formation, the first aluminum oxide film 102 containing boron can be formed by a sputtering method using an aluminum oxide target into which boron ions are implanted.

The oxygen-excess insulating layer 103 over the first aluminum oxide film 102 containing boron is formed in order to supply oxygen to the oxide semiconductor film 122 in contact with the oxygen-excess insulating layer 103. Note that the oxygen-excess insulating layer 103 may be omitted. The oxygen-excess insulating layer 103 is preferably an oxide insulating layer, and more preferably contains oxygen in excess of the stoichiometric composition. For example, the oxygen-excess insulating layer may be formed in such a manner that film formation is performed under an oxygen atmosphere or oxygen is introduced to a deposited oxide insulating layer. As a method for introducing oxygen, an ion implantation method, an ion doping method, a plasma immersion ion implantation method, plasma treatment, or the like may be employed. The number of oxygen atoms can be measured by Rutherford backscattering spectrometry (RBS).

The oxide semiconductor film 122 is formed using a material containing two or more elements selected from In, Ga, Sn, and Zn. For example, the oxide semiconductor film 122 is formed using an In—Ga—Zn—O-based oxide semiconductor. An In—Ga—Zn—O-based non-single-crystal oxide semiconductor film can be obtained by a sputtering method using an oxide semiconductor target containing indium (In), gallium (Ga), and zinc (Zn). Alternatively, the oxide semiconductor film 122 can be formed by a chemical vapor deposition (CVD) method, an MBE method, a PLD method, an atomic layer deposition (ALD) method, or the like. In the case where an In—Ga—Zn—O oxide layer is formed by an MOCVD method, trimethylindium, trimethylgallium, dimethylzinc, and the like may be used as source gases. The combination of the source gases is not limited to the above: triethylindium or the like may be used instead of trimethylindium; triethylgallium or the like may be used instead of trimethylgallium; and diethylzinc or the like may be used instead of dimethylzinc. Etching or the like is performed after formation of the In—Ga—Zn—O-based non-single-crystal oxide semiconductor film, whereby the oxide semiconductor film 122 having an island shape can be formed.

In the case where hydrogen is contained in the oxide semiconductor film, oxygen vacancies are formed in the film in some cases. Since the oxygen vacancies cause a change in the carrier density of an oxide semiconductor film, the electric characteristics of the oxide semiconductor film are changed. Heat treatment at a temperature higher than or equal to 400° C. and lower than or equal to the strain point of the substrate, preferably at a temperature higher than or equal to 400° C. and lower than or equal to 450° C. may be performed in order to reduce hydrogen in the oxide semiconductor film.

Although there is no particular limitation on the gate insulating film 112 over the oxide semiconductor film 122, at least a film not containing hydrogen much is preferable. It is also possible to use an aluminum oxide film containing boron as the gate insulating film 112. The first aluminum oxide film 102 containing boron may be formed under the oxide semiconductor film 122 to be in contact with the oxide semiconductor film 122 such that the oxide semiconductor film 122 is surrounded by the aluminum oxide films containing boron.

The gate electrode 114 is formed by a sputtering method to have a thickness greater than or equal to 100 nm and less than or equal to 200 nm. The gate electrode 114 can be formed using an element selected from tantalum (Ta), tungsten (W), titanium (Ti), molybdenum (Mo), chromium (Cr), niobium (Nb), and the like, or an alloy material or a compound material which contains any of these elements as its main component. Moreover, a semiconductor material typified by polycrystalline silicon doped with an impurity element such as phosphorus can be used.

The interlayer insulating film 124 may be formed to have a stacked-layer structure or a single-layer structure using, for example, silicon oxide, silicon oxynitride, silicon nitride oxide, silicon nitride, or the like. For example, the interlayer insulating film 124 may be formed by a thermal oxidation method, a CVD method, a sputtering method, or the like. A silicon nitride film or a silicon nitride oxide film which does not contain hydrogen much is preferably used as the interlayer insulating film 124.

The wirings 116 can be formed using an element selected from aluminum, tungsten, titanium, tantalum, molybdenum, nickel, platinum, copper, gold, silver, manganese, neodymium, carbon, and silicon, or an alloy material or a compound material which contains any of these elements as its main component. Further, a stacked-layer structure of one or plural kinds of the above-described materials can be used. A wiring formed using copper containing manganese is known as a wiring formed using an alloy material which contains copper as its main component. Manganese in the copper wiring may be transferred to a portion where the wiring and the oxide semiconductor film are in contact with each other by heating after formation of the wiring so that an oxide of manganese is formed and that the reliability of the semiconductor device is increased. When a manganese layer or a titanium layer is formed between the oxide semiconductor film and the copper wiring in advance as an example of a stacked-layer structure, whereby the reliability of the semiconductor device can also be increased. As an alloy material containing aluminum as its main component, for example, a material which contains aluminum as its main component and also contains nickel, an alloy material which contains aluminum as its main component and also contains nickel and one or both of carbon and silicon, or the like can be used.

The second aluminum oxide film 117 containing boron can be formed in a manner similar to that of the first aluminum oxide film 102 containing boron. Note that it is not necessary to provide both the first aluminum oxide film 102 containing boron and the second aluminum oxide film 117 containing boron, and one of the aluminum oxide films containing boron may be omitted.

With the above-described structure, a transistor can have a large current value in an on state. A transistor with small current in an off state can be provided. A transistor having stable electric characteristics can be provided. A semiconductor device including the transistor can be provided. A robust semiconductor device can be provided. A novel semiconductor device can be provided.

(Embodiment 2)

In this embodiment, an example of a bottom-gate transistor is described.

Figure 2A:
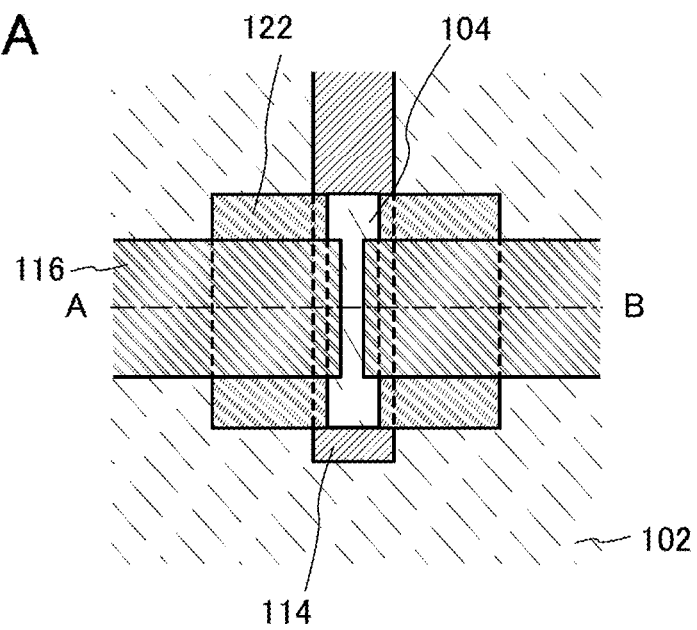
FIGS. 2A and 2B are a top view and a cross-sectional view illustrating a transistor of one embodiment of the present invention.
Figure 2B:
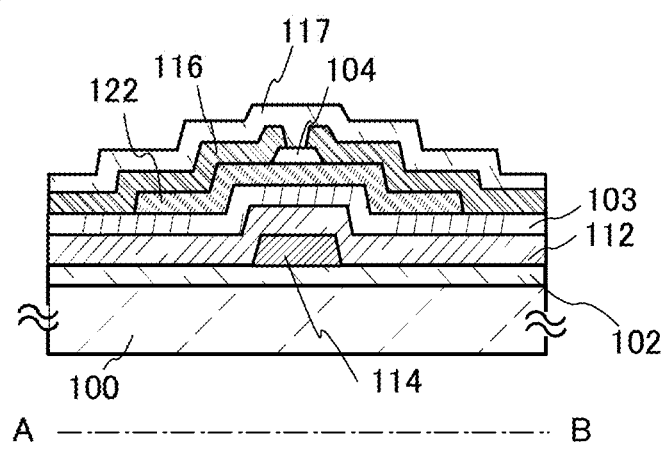

FIGS. 2A and 2B are a top view and a cross-sectional view of a bottom-gate transistor. FIG. 2A is a top view and FIG. 2B is a cross-sectional view taken along line A-B in FIG. 2A. Note that in FIG. 2A, some components of a transistor (e.g., the gate insulating film 112) are omitted for simplicity.

The transistor illustrated in FIGS. 2A and 2B includes the substrate 100; the first aluminum oxide film 102 containing boron over the substrate 100; the gate electrode 114 over the first aluminum oxide film 102 containing boron; the gate insulating film 112 over the gate electrode 114; the oxygen-excess insulating layer 103 over the gate insulating film 112; the oxide semiconductor film 122 in contact with the oxygen-excess insulating layer 103; an insulating film 104 over the oxide semiconductor film 122; the wirings 116 connected to the oxide semiconductor film 122; and the second aluminum oxide film 117 containing boron and covering the insulating film 104 over the oxide semiconductor film 122 and the wirings 116 connected to the oxide semiconductor film 122. The number of oxygen atoms can be measured by Rutherford backscattering spectrometry (RBS).

There is no particular limitation on a substrate that can be used as the substrate 100 as long as it has at least heat resistance to withstand later heat treatment. For example, a glass substrate made of barium borosilicate glass, aluminoborosilicate glass, or the like can be used.

In the case where the temperature of heat treatment to be performed later is high, a glass substrate whose strain point is 730° C. or higher is preferably used. For the glass substrate, a glass material such as aluminosilicate glass, aluminoborosilicate glass, or barium borosilicate glass is used, for example. By containing a larger amount of barium oxide (BaO) than boron oxide, a more practical heat-resistant glass substrate is obtained. Therefore, a glass substrate containing a larger amount of BaO than $B_2O_3$ is preferably used.

Note that instead of the above glass substrate, a substrate formed using an insulator such as a ceramic substrate, a quartz substrate, a sapphire substrate, or the like may be used. Alternatively, crystallized glass or the like may be used.

The first aluminum oxide film 102 containing boron over the substrate 100 and the second aluminum oxide film 117 containing boron and covering the wirings 116 are formed in order to prevent hydrogen from diffusing into the oxide semiconductor film 122. Note that it is not necessary to provide both the first aluminum oxide film 102 containing boron and the second aluminum oxide film 117 containing boron, and one of the first and second aluminum oxide films containing boron may be omitted.

In this embodiment, for the first aluminum oxide film 102 containing boron, a 50-nm-thick aluminum oxide film is formed by a sputtering method using an aluminum oxide target under the following conditions: an argon (Ar) gas at a flow rate of 25 sccm and an oxygen ($O_2$) gas at a flow rate of 25 sccm are used as deposition gases; the pressure is 0.4 Pa; the substrate temperature is 250° C.; the distance between the target and the substrate is 60 mm; and an RF power of 2.5 kW is applied. Then, boron ions are implanted into the aluminum oxide film with an acceleration voltage of 7 keV and a dose of $1 \times 10^{16}$ ions/cm$^2$. Thus, the first aluminum oxide film 102 containing boron can be formed.

Other than the method for implanting boron ions into an aluminum oxide film after film formation, the first aluminum oxide film 102 containing boron can be formed by a sputtering method using an aluminum oxide target into which boron ions are implanted.

The gate electrode 114 is formed by a sputtering method to have a thickness greater than or equal to 100 nm and less than or equal to 200 nm. The gate electrode 114 can be formed using an element selected from tantalum (Ta), tungsten (W), titanium (Ti), molybdenum (Mo), chromium (Cr), niobium (Nb), and the like, or an alloy material or a compound material which contains any of these elements as its main component. Moreover, a semiconductor material typified by polycrystalline silicon doped with an impurity element such as phosphorus can be used.

Although there is no particular limitation on the gate insulating film 112, at least a film not containing hydrogen much is preferable. It is also possible to use an aluminum oxide film containing boron as the gate insulating film 112.

The oxygen-excess insulating layer 103 is formed in order to supply oxygen to the oxide semiconductor film 122 in contact with the oxygen-excess insulating layer 103. Note that the oxygen-excess insulating layer 103 may be omitted. The oxygen-excess insulating layer 103 is preferably an oxide insulating layer, and more preferably contains oxygen in excess of the stoichiometric composition. For example, the oxygen-excess insulating layer may be formed in such a manner that film formation is performed under an oxygen atmosphere or oxygen is introduced to a deposited oxide insulating layer. As a method for introducing oxygen, an ion implantation method, an ion doping method, a plasma immersion ion implantation method, plasma treatment, or the like may be employed.

The oxide semiconductor film 122 is formed using a material containing two or more elements selected from In, Ga, Sn, and Zn. For example, the oxide semiconductor film 122 is formed using an In—Ga—Zn—O-based oxide semiconductor. An In—Ga—Zn—O-based non-single-crystal oxide semiconductor film can be obtained by a sputtering method using an oxide semiconductor target containing indium (In), gallium (Ga), and zinc (Zn). Alternatively, the oxide semiconductor film 122 can be formed by a CVD method, an MBE method, a PLD method, an ALD method, or the like. In the case where an In—Ga—Zn—O oxide layer is formed by an MOCVD method, trimethylindium, trimethylgallium, dimethylzinc, and the like may be used as source gases. The combination of the source gases is not limited to the above: triethylindium or the like may be used instead of trimethylindium; triethylgallium or the like may be used instead of trimethylgallium; and diethylzinc or the like may be used instead of dimethylzinc. Etching or the like is performed after formation of the In—Ga—Zn—O-based non-single-crystal oxide semiconductor film, whereby the oxide semiconductor film 122 having an island shape can be formed.

In the case where hydrogen is contained in the oxide semiconductor film, oxygen vacancies are formed in the film in some cases. Since the oxygen vacancies cause a change in the carrier density of an oxide semiconductor film, the electric characteristics of the oxide semiconductor film are changed. Heat treatment at a temperature higher than or equal to 400° C. and lower than or equal to the strain point of the substrate, preferably at a temperature higher than or equal to 400° C. and lower than or equal to 450° C. may be performed in order to reduce hydrogen in the oxide semiconductor film.

The insulating film 104 may be formed to have a stacked-layer structure or a single-layer structure using, for example, silicon oxide, silicon oxynitride, silicon nitride oxide, silicon nitride, or the like. For example, the insulating film 104 may be formed by a thermal oxidation method, a CVD method, a sputtering method, or the like. A silicon nitride film or a silicon nitride oxide film which does not contain hydrogen much is preferably used as the insulating film 104. When the island-shaped oxide semiconductor film 122 and the insulating film 104 are formed successively without exposure to the air, the interface therebetween can be kept clean, resulting in the stable electric characteristics of the transistor. Furthermore, a region to be a channel of the transistor in the island-shaped oxide semiconductor film 122 can be protected by the insulating film 104 in the formation of the wirings 116 and the second aluminum oxide film 117 containing boron, whereby the transistor can have stable electric characteristics. Etching of the insulating film 104 is performed such that the width of the insulating film 104 becomes equal to or slightly less than the width of the gate electrode 114. For example, the insulating film 104 can be formed in a self-aligned manner using backside exposure. When the insulating film 104 has such a structure, parasitic capacitance between the gate electrode 114 and the wirings 116 can be reduced.

The wirings 116 can be formed using an element selected from aluminum, tungsten, titanium, tantalum, molybdenum, nickel, platinum, copper, gold, silver, manganese, neodymium, carbon, and silicon, or an alloy material or a compound material which contains any of these elements as its main component. Further, a stacked-layer structure of one or plural kinds of the above-described materials can be used. A wiring formed using copper containing manganese is known as a wiring formed using an alloy material which contains copper as its main component. Manganese in the copper wiring may be transferred to a portion where the wiring and the oxide semiconductor film are in contact with each other by heating after formation of the wiring so that an oxide of manganese is formed and that the reliability of the semiconductor device is increased. When a manganese layer or a titanium layer is formed between the oxide semiconductor film and the copper wiring in advance as an example of a stacked-layer structure, whereby the reliability of the semiconductor device can also be increased. As an alloy material containing aluminum as its main component, for example, a material which contains aluminum as its main component and also contains nickel, an alloy material which contains aluminum as its main component and also contains nickel and one or both of carbon and silicon, or the like can be used.

The second aluminum oxide film 117 containing boron can be formed in a manner similar to that of the first aluminum oxide film 102 containing boron. Note that it is not necessary to provide both the first aluminum oxide film 102 containing boron and the second aluminum oxide film 117 containing boron, and one of the aluminum oxide films containing boron may be omitted.

With the above-described structure, a transistor can have a large current value in an on state. A transistor with small current in an off state can be provided. A transistor having stable electric characteristics can be provided. A semiconductor device including the transistor can be provided. A robust semiconductor device can be provided. A novel semiconductor device can be provided.

(Embodiment 3)

In this embodiment, an example of a bottom-gate transistor is described.

Figure 3A:
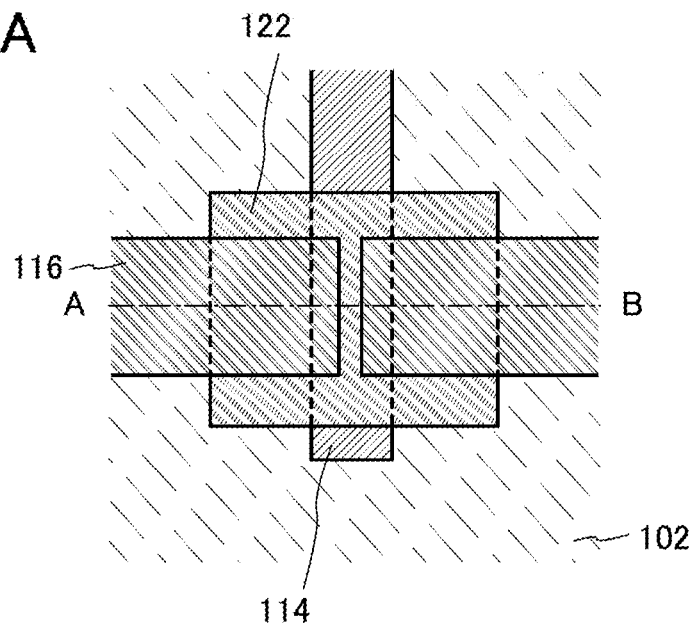
FIGS. 3A and 3B are a top view and a cross-sectional view illustrating a transistor of one embodiment of the present invention.
Figure 3B:
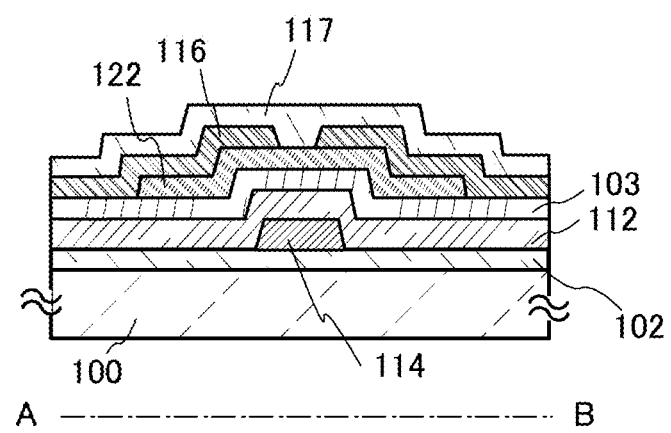

FIGS. 3A and 3B are a top view and a cross-sectional view of a top-gate transistor. FIG. 3A is a top view and FIG. 3B is a cross-sectional view taken along line A-B in FIG. 3A. Note that in FIG. 3A, some components of a transistor (e.g., the gate insulating film 112) are omitted for simplicity.

The transistor illustrated in FIGS. 3A and 3B includes the substrate 100; the first aluminum oxide film 102 containing boron over the substrate 100; the gate electrode 114 over the first aluminum oxide film 102 containing boron; the gate insulating film 112 over the gate electrode 114; the oxygen-excess insulating layer 103 over the gate insulating film 112; the oxide semiconductor film 122 in contact with the oxygen-excess insulating layer 103; the wirings 116 connected to the oxide semiconductor film 122; and the second aluminum oxide film 117 containing boron and covering the wirings 116 connected to the oxide semiconductor film 122. The number of oxygen atoms can be measured by Rutherford backscattering spectrometry (RBS).

There is no particular limitation on a substrate that can be used as the substrate 100 as long as it has at least heat resistance to withstand later heat treatment. For example, a glass substrate made of barium borosilicate glass, aluminoborosilicate glass, or the like can be used.

In the case where the temperature of heat treatment to be performed later is high, a glass substrate whose strain point is 730° C. or higher is preferably used. For the glass substrate, a glass material such as aluminosilicate glass, aluminoborosilicate glass, or barium borosilicate glass is used, for example. By containing a larger amount of barium oxide (BaO) than boron oxide, a more practical heat-resistant glass substrate is obtained. Therefore, a glass substrate containing a larger amount of BaO than $B_2O_3$ is preferably used.

Note that instead of the above glass substrate, a substrate formed using an insulator such as a ceramic substrate, a quartz substrate, a sapphire substrate, or the like may be used. Alternatively, crystallized glass or the like may be used.

The first aluminum oxide film 102 containing boron over the substrate 100 and the second aluminum oxide film 117 containing boron and covering the wirings 116 are formed in order to prevent hydrogen from diffusing into the oxide semiconductor film 122. Note that it is not necessary to provide both the first aluminum oxide film 102 containing boron and the second aluminum oxide film 117 containing boron, and one of the first and second aluminum oxide films containing boron may be omitted.

In this embodiment, for the first aluminum oxide film 102 containing boron, a 50-nm-thick aluminum oxide film is formed by a sputtering method using an aluminum oxide target under the following conditions: an argon (Ar) gas at a flow rate of 25 sccm and an oxygen ($O_2$) gas at a flow rate of 25 sccm are used as deposition gases; the pressure is 0.4 Pa; the substrate temperature is 250° C.; the distance between the target and the substrate is 60 mm; and an RF power of 2.5 kW is applied. Then, boron ions are implanted into the aluminum oxide film with an acceleration voltage of 7 keV and a dose of $1\times10^{16}$ ions/cm$^2$. Thus, the first aluminum oxide film 102 containing boron can be formed.

Other than the method for implanting boron ions into an aluminum oxide film after film formation, the first aluminum oxide film 102 containing boron can be formed by a sputtering method using an aluminum oxide target into which boron ions are implanted.

The gate electrode 114 is formed by a sputtering method to have a thickness greater than or equal to 100 nm and less than or equal to 200 nm. The gate electrode 114 can be formed using an element selected from tantalum (Ta), tungsten (W), titanium (Ti), molybdenum (Mo), chromium (Cr), niobium (Nb), and the like, or an alloy material or a compound material which contains any of these elements as its main component. Moreover, a semiconductor material typified by polycrystalline silicon doped with an impurity element such as phosphorus can be used.

Although there is no particular limitation on the gate insulating film 112, at least a film not containing hydrogen much is preferable. It is also possible to use an aluminum oxide film containing boron as the gate insulating film 112.

The oxygen-excess insulating layer 103 is formed in order to supply oxygen to the oxide semiconductor film 122 in contact with the oxygen-excess insulating layer 103. Note that the oxygen-excess insulating layer 103 may be omitted. The oxygen-excess insulating layer 103 is preferably an oxide insulating layer, and more preferably contains oxygen in excess of the stoichiometric composition. For example, the oxygen-excess insulating layer may be formed in such a manner that film formation is performed under an oxygen atmosphere or oxygen is introduced to a deposited oxide insulating layer. As a method for introducing oxygen, an ion implantation method, an ion doping method, a plasma immersion ion implantation method, plasma treatment, or the like may be employed.

The oxide semiconductor film 122 is formed using a material containing two or more elements selected from In, Ga, Sn, and Zn. For example, the oxide semiconductor film 122 is formed using an In—Ga—Zn—O-based oxide semiconductor. An In—Ga—Zn—O-based non-single-crystal oxide semiconductor film can be obtained by a sputtering method using an oxide semiconductor target containing indium (In), gallium (Ga), and zinc (Zn). Alternatively, the oxide semiconductor film 122 can be formed by a CVD method, an MBE method, a PLD method, an ALD method, or the like. In the case where an In—Ga—Zn—O oxide layer is formed by an MOCVD method, trimethylindium, trimethylgallium, dimethylzinc, and the like may be used as source gases. The combination of the source gases is not limited to the above: triethylindium or the like may be used instead of trimethylindium; triethylgallium or the like may be used instead of trimethylgallium; and diethylzinc or the like may be used instead of dimethylzinc. Etching or the like is performed after formation of the In—Ga—Zn—O-based non-single-crystal oxide semiconductor film, whereby the oxide semiconductor film 122 having an island shape can be formed.

In the case where hydrogen is contained in the oxide semiconductor film, oxygen vacancies are formed in the film in some cases. Since the oxygen vacancies cause a change in the carrier density of an oxide semiconductor film, the electric characteristics of the oxide semiconductor film are changed. Heat treatment at a temperature higher than or equal to 400° C. and lower than or equal to the strain point of the substrate, preferably at a temperature higher than or equal to 400° C. and lower than or equal to 450° C. may be performed in order to reduce hydrogen in the oxide semiconductor film.

The wirings 116 can be formed using an element selected from aluminum, tungsten, titanium, tantalum, molybdenum, nickel, platinum, copper, gold, silver, manganese, neodymium, carbon, and silicon, or an alloy material or a compound material which contains any of these elements as its main component. Further, a stacked-layer structure of one or plural kinds of the above-described materials can be used. A wiring formed using copper containing manganese is known as a wiring formed using an alloy material which contains copper as its main component. Manganese in the copper wiring may be transferred to a portion where the wiring and the oxide semiconductor film are in contact with each other by heating after formation of the wiring so that an oxide of manganese is formed and that the reliability of the semiconductor device is increased. When a manganese layer or a titanium layer is formed between the oxide semiconductor film and the copper wiring in advance as an example of a stacked-layer structure, whereby the reliability of the semiconductor device can also be increased. As an alloy material containing aluminum as its main component, for example, a material which contains aluminum as its main component and also contains nickel, an alloy material which contains aluminum as its main component and also contains nickel and one or both of carbon and silicon, or the like can be used. As compared with the structure of the transistor described in Embodiment 2, the number of masks can be reduced in the structure of the transistor in this embodiment, leading to reduction in manufacturing cost. Furthermore, the width of a portion to be a channel in the island-shaped oxide semiconductor film 122 in the transistor of this embodiment can be smaller than that in the transistor described in Embodiment 2. Thus, the transistor can have smaller size or improved electric characteristics. Etching is performed such that the widths of the wirings 116 are equal to or slightly smaller than the width of the gate electrode 114. When the transistor has such a structure, parasitic capacitance between the gate electrode 114 and the wirings 116 can be reduced. Although the wirings 116 are formed over the oxide semiconductor film 122 in FIG. 3B, the wirings 116 may be formed under the oxide semiconductor film 122.

The second aluminum oxide film 117 containing boron can be formed in a manner similar to that of the first aluminum oxide film 102 containing boron. Note that it is not necessary to provide both the first aluminum oxide film 102 containing boron and the second aluminum oxide film 117 containing boron, and one of the aluminum oxide films containing boron may be omitted.

With the above-described structure, a transistor can have a large current value in an on state. A transistor with small current in an off state can be provided. A transistor having stable electric characteristics can be provided. A semiconductor device including the transistor can be provided. A robust semiconductor device can be provided. A novel semiconductor device can be provided.

(Embodiment 4)

Figure 4A:
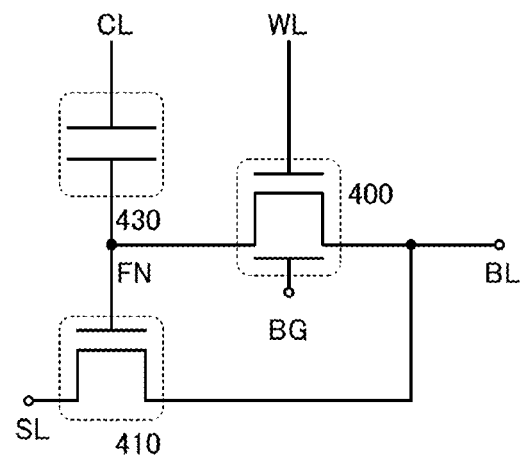
FIGS. 4A and 4B are a circuit diagram and a cross-sectional view illustrating a transistor of one embodiment of the present invention.

FIG. 4A is an example of a circuit diagram of a semiconductor device of one embodiment of the present invention. A semiconductor device shown in FIG. 4A includes a first transistor 410, a second transistor 400, a capacitor 430, a wiring SL, a wiring BL, a wiring WL, a wiring CL, and a wiring BG.

One of a source and a drain of the first transistor 410 is electrically connected to the wiring BL, the other is electrically connected to the wiring SL, and a gate of the first transistor 410 is electrically connected to one of a source and a drain of the second transistor 400 and one electrode of the capacitor 430. The other of the source and the drain of the second transistor 400 is electrically connected to the wiring BL, and a gate of the second transistor 400 is electrically connected to the wiring WL. The other electrode of the capacitor 430 is electrically connected to the wiring CL. The wiring BG is electrically connected to a second gate of the second transistor 400. Note that a node between the gate of the first transistor 410, the one of the source and the drain of the second transistor 400, and the one electrode of the capacitor 430 is referred to as a node FN.

The semiconductor device shown in FIG. 4A supplies a potential corresponding to the potential of the wiring BL to the node FN when the second transistor 400 is in an on state (i.e., is on). Meanwhile, the semiconductor device has a function of retaining the potential of the node FN when the second transistor 400 is in an off state (i.e., is off). In other words, the semiconductor device shown in FIG. 4A functions as a memory cell of a memory device. Note that the semiconductor device shown in FIG. 4A can function as a pixel of a display device in the case where the semiconductor device includes a display element such as a liquid crystal element or an organic electroluminescence (EL) element electrically connected to the node FN.

The on/off state of the second transistor 400 can be selected in accordance with the potential supplied to the wiring WL or the wiring BG. The threshold voltage of the second transistor 400 can be controlled by the potential supplied to the wiring WL or the wiring BG. By using a transistor with small off-state current as the second transistor 400, the potential of the node FN can be retained for a long period when the transistor is off. This can reduce the frequency of refresh operations of the semiconductor device; thus, the semiconductor device can have low power consumption. An example of the transistor with small off-state current is a transistor including an oxide semiconductor.

Note that a reference potential, a ground potential, or a fixed potential such as an arbitrary fixed potential is supplied to the wiring CL. At this time, the apparent threshold voltage of the second transistor 400 changes depending on the potential of the node FN. Conduction and non-conduction states of the first transistor 410 change in response to the change in the apparent threshold voltage; thus, data of a potential retained in the node FN can be read as data.

A plurality of the semiconductor devices shown in FIG. 4A is arranged in a matrix, whereby a memory device (memory cell array) can be formed.

Figure 4B:
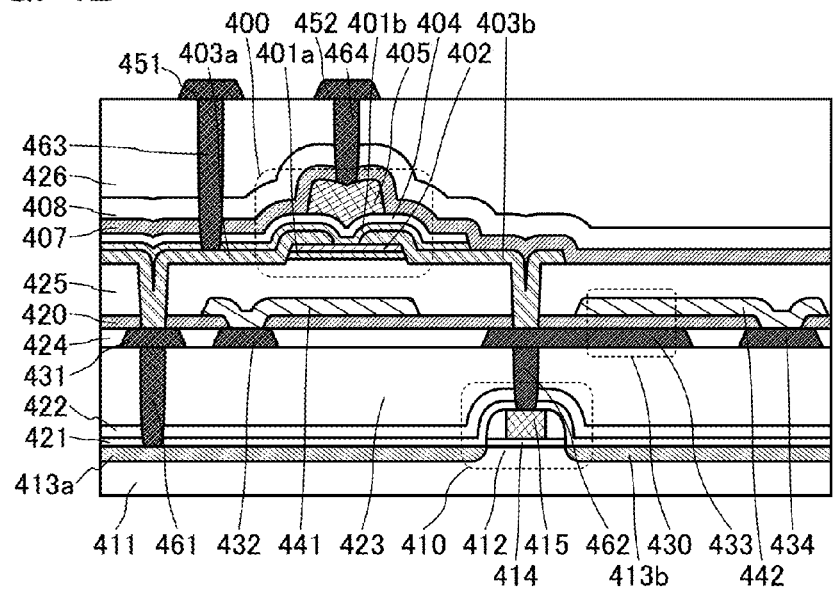

FIG. 4B illustrates an example of a cross-sectional structure of a semiconductor device in which the circuit shown in FIG. 4A can be obtained.

The semiconductor device includes the first transistor 410, the second transistor 400, and the capacitor 430. The second transistor 400 is provided over the first transistor 410. A barrier layer 420 is provided between the first transistor 410 and the second transistor 400. An aluminum oxide film containing boron is formed as the barrier layer 420.

[First Layer]

The first transistor 410 is provided on a semiconductor substrate 411 and includes a semiconductor layer 412 that is a portion of the semiconductor substrate 411, a gate insulating layer 414, a gate electrode 415, and low-resistance layers 413a and 413b serving as source and drain regions.

The first transistor 410 may be either a p-channel transistor or an n-channel transistor, and an appropriate transistor may be used depending on the circuit configuration or the driving method.

It is preferable that a region of the semiconductor layer 412 where a channel is formed, a region in the vicinity thereof, the low-resistance layers 413a and 413b serving as source and drain regions, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Alternatively, silicon having crystal lattice distortion may be contained. Alternatively, the first transistor 410 may be a high-electron-mobility transistor (HEMT) with GaAs and AlGaAs or the like.

The low-resistance layers 413a and 413b contain an element that imparts n-type conductivity, such as phosphorus, or an element that imparts p-type conductivity, such as boron, in addition to a semiconductor material used for the semiconductor layer 412.

The gate electrode 415 can be formed using a semiconductor material such as silicon containing the element that imparts n-type conductivity, such as phosphorus, or the element that imparts p-type conductivity, such as boron, or a conductive material such as a metal material, an alloy material, or a metal oxide material. It is particularly preferable to use a high-melting-point material that has both heat resistance and conductivity, such as tungsten or molybdenum, and it is particularly preferable to use tungsten.

[First Insulating Layer]

The first transistor 410 is covered with an insulating layer 421, an insulating layer 422, and an insulating layer 423 that are stacked in this order.

In the manufacturing process of the semiconductor device, the insulating layer 421 functions as a protective film in activation of an element imparting conductivity that is added to the low-resistance layer 413a and the low-resistance layer 413b. The insulating layer 421 is not necessarily provided when not needed.

In the case where a silicon-based semiconductor material is used for the semiconductor layer 412, the insulating layer 422 preferably contains hydrogen. When the insulating layer 422 containing hydrogen is provided over the first transistor 410 and heat treatment is performed, dangling bonds in the semiconductor layer 412 are terminated by hydrogen contained in the insulating layer 422, so that the reliability of the first transistor 410 can be improved.

The insulating layer 423 functions as a planarization film for eliminating a level difference caused by the first transistor 410 or the like underlying the insulating layer 423. A top surface of the insulating layer 423 may be planarized by planarization treatment using a chemical mechanical polishing (CMP) method or the like in order to increase the planarity.

In the insulating layers 421, 422, and 423, a plug 461 electrically connected to the low-resistance layers 413a and 413b and the like, a plug 462 electrically connected to the gate electrode 415 of the first transistor 410, and the like may be embedded.

[First Wiring Layer]

A wiring 431, a wiring 432, a wiring 433, and a wiring 434 are provided over the insulating layer 423.

The wiring 431 is electrically connected to the plug 461. The wiring 433 is electrically connected to the plug 462, and part of the wiring 433 functions as a first electrode of the capacitor 430.

Note that in this specification and the like, an electrode and a wiring electrically connected to the electrode may be a single component. In other words, there are cases where a portion of a wiring functions as an electrode and where a portion of an electrode functions as a wiring.

The wirings 431, 432, 433, and 434, and the like can be formed using a conductive material such as a metal material, an alloy material, or a metal oxide material. It is particularly preferable to use a high-melting-point material that has both high heat resistance and high conductivity, such as tungsten or molybdenum, and it is particularly preferable to use tungsten.

It is preferable that the wirings 431, 432, 433, and 434, and the like be embedded in an insulating layer 424 and that top surfaces of the insulating layer 424, the wirings 431, 432, 433, and 434, and the like be planarized.

[Barrier Layer]

The barrier layer 420 is provided to cover the top surfaces of the insulating layer 424, the wirings 431, 432, 433, and 434, and the like.

The barrier layer 420 also functions as a dielectric layer of the capacitor 430 in a region where a wiring 442 described later overlaps with the wiring 433.

The barrier layer 420 has an opening for electrically connecting the wiring 432 to a wiring 441 described later and an opening for electrically connecting the wiring 434 to the wiring 442 described later.

When the barrier layer 420 is formed using an aluminum oxide film containing boron, hydrogen contained in the insulating layer 422 is prevented from diffusing across the barrier layer.

[Second Wiring Layer]

The wirings 441 and 442, and the like are provided over the barrier layer 420.

The wiring 441 is electrically connected to the wiring 432 through the opening formed in the barrier layer 420. Part of the wiring 441 overlaps with a channel formation region of the second transistor 400, which is described later, and functions as the second gate electrode of the second transistor 400.

The wiring 442 is electrically connected to the wiring 434 through the opening formed in the barrier layer 420. Part of the wiring 442 overlaps with the wiring 433 and functions as a second electrode of the capacitor 430.

Here, the wirings 441 and 442, and the like can be formed using a conductive material such as a metal material, an alloy material, or a metal oxide material. In the case where heat resistance is required, it is particularly preferable to use a high-melting-point material such as tungsten or molybdenum. A low-resistance metal material or a low-resistance alloy material is preferably used in consideration of conductivity; a single layer or a stack using a metal material such as aluminum, chromium, copper, tantalum, or titanium or an alloy material containing any of the metal materials may be used.

It is preferable to use a metal oxide containing an element other than a main component such as phosphorus, boron, carbon, nitrogen, or a transition metal element as a material for forming the wirings 441 and 442, and the like. Such a metal oxide can have high conductivity. For example, a material in which any of the above elements is contained in a metal oxide such as an In—Ga-based oxide, an In—Zn-based oxide, or an In-M-Zn-based oxide (M is Al, Ti, Ga, Y, Zr, La, Ce, Nd, or Hf) to increase the conductivity can be used. Furthermore, such a metal oxide is relatively impermeable to oxygen. Thus, by filling the openings formed in the barrier layer 420 with the wirings 441 and 442, and the like containing such a material, diffusion of oxygen released from an insulating layer 425 described later, when heat treatment is performed, to the layers under the barrier layer 420 can be suppressed. Consequently, the amount of oxygen that is released from the insulating layer 425 and can be supplied to a semiconductor layer in the second transistor 400 can be increased.

It is preferable that the top surface of the insulating layer 425 be planarized by planarization treatment described above.

An oxide material from which oxygen is partly released by heating is preferably used for the insulating layer 425.

As the oxide material from which oxygen is released by heating, an oxide containing oxygen more than that in the stoichiometric composition is preferably used. Part of oxygen is released by heating from an oxide film containing oxygen more than that in the stoichiometric composition.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

[Second Layer]

The second transistor 400 is provided over the insulating layer 425.

The second transistor 400 includes a first oxide layer 401a in contact with a top surface of the insulating layer 425; a semiconductor layer 402 in contact with a top surface of the first oxide layer 401a; an electrode 403a and an electrode 403b in contact with a top surface of the semiconductor layer 402 and apart from each other in a region overlapping with the semiconductor layer 402; a second oxide layer 401b in contact with the top surface of the semiconductor layer 402; a gate insulating layer 404 over the second oxide layer 401b; and a gate electrode 405 overlapping with the semiconductor layer 402 with the gate insulating layer 404 and the second oxide layer 401b therebetween. An insulating layer 407, an insulating layer 408, and an insulating layer 426 are provided to cover the second transistor 400. At least one of the gate insulating layer 404, the insulating layer 407, the insulating layer 408, and the insulating layer 426 may be formed using an aluminum oxide film containing boron.

Note that at least part (or all) of the electrode 403a (and/or the electrode 403b) is provided on at least part (or all) of a surface, a side surface, a top surface, and/or a bottom surface of a semiconductor layer such as the semiconductor layer 402 (and/or the first oxide layer 401a).

Alternatively, at least part (or all) of the electrode 403a (and/or the electrode 403b) is in contact with at least part (or all) of a surface, a side surface, a top surface, and/or a bottom surface of a semiconductor layer such as the semiconductor layer 402 (and/or the first oxide layer 401a).

Alternatively, at least part (or all) of the electrode 403a (and/or the electrode 403b) is in contact with at least part (or all) of a semiconductor layer such as the semiconductor layer 402 (and/or the first oxide layer 401a).

Alternatively, at least part (or all) of the electrode 403a (and/or the electrode 403b) is electrically connected to at least part (or all) of a surface, a side surface, a top surface, and/or a bottom surface of a semiconductor layer such as the semiconductor layer 402 (and/or the first oxide layer 401a).

Alternatively, at least part (or all) of the electrode 403a (and/or the electrode 403b) is electrically connected to at least part (or all) of a semiconductor layer such as the semiconductor layer 402 (and/or the first oxide layer 401a).

Alternatively, at least part (or all) of the electrode 403a (and/or the electrode 403b) is provided near at least part (or all) of a surface, a side surface, a top surface, and/or a bottom surface of a semiconductor layer such as the semiconductor layer 402 (and/or the first oxide layer 401a).

Alternatively, at least part (or all) of the electrode 403a (and/or the electrode 403b) is provided near at least part (or all) of a semiconductor layer such as the semiconductor layer 402 (and/or the first oxide layer 401a).

Alternatively, at least part (or all) of the electrode 403a (and/or the electrode 403b) is placed on a side of at least part (or all) of a surface, a side surface, a top surface, and/or a bottom surface of a semiconductor layer such as the semiconductor layer 402 (and/or the first oxide layer 401a).

Alternatively, at least part (or all) of the electrode 403a (and/or the electrode 403b) is placed on a side of at least part (or all) of a semiconductor layer such as the semiconductor layer 402 (and/or the first oxide layer 401a).

Alternatively, at least part (or all) of the electrode 403a (and/or the electrode 403b) is provided obliquely above at least part (or all) of a surface, a side surface, a top surface, and/or a bottom surface of a semiconductor layer such as the semiconductor layer 402 (and/or the first oxide layer 401a).

Alternatively, at least part (or all) of the electrode 403a (and/or the electrode 403b) is provided obliquely above at least part (or all) of a semiconductor layer such as the semiconductor layer 402 (and/or the first oxide layer 401a).

Alternatively, at least part (or all) of the electrode 403a (and/or the electrode 403b) is provided above at least part (or all) of a surface, a side surface, a top surface, and/or a bottom surface of a semiconductor layer such as the semiconductor layer 402 (and/or the first oxide layer 401a).

Alternatively, at least part (or all) of the electrode 403a (and/or the electrode 403b) is provided above at least part (or all) of a semiconductor layer such as the semiconductor layer 402 (and/or the first oxide layer 401a).

The semiconductor layer 402 may contain a semiconductor such as a silicon-based semiconductor in a region where a channel is formed. It is particularly preferable that the semiconductor layer 402 contain a semiconductor having a wider band gap than silicon. The semiconductor layer 402 preferably contains an oxide semiconductor. A semiconductor material having a wider band gap and a lower carrier density than silicon is preferably used because off-state current of the transistor can be reduced.

For example, the oxide semiconductor preferably contains at least indium (In) or zinc (Zn). More preferably, the oxide semiconductor contains an oxide represented by an In-M-Zn—O-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which changes in the electric characteristics are suppressed.

A semiconductor device of one embodiment of the present invention preferably includes, between an oxide semiconductor film and an insulating layer overlapping with the oxide semiconductor film, an oxide layer that contains as its constituent element at least one of the metal elements constituting the oxide semiconductor film. This can prevent formation of a trap state at the interface between the oxide semiconductor film and the insulating layer overlapping with the oxide semiconductor film.

That is, one embodiment of the present invention preferably has a structure in which each of the top surface and the bottom surface of at least the channel formation region of the oxide semiconductor film is in contact with an oxide layer that functions as a barrier film for preventing formation of an interface state of the oxide semiconductor film. With this structure, formation of oxygen vacancies and entry of impurities that cause generation of carriers in the oxide semiconductor film and at the interface can be prevented. Thus, a highly purified intrinsic oxide semiconductor film can be obtained. Obtaining a highly purified intrinsic oxide semiconductor film refers to purifying the oxide semiconductor film to be an intrinsic or substantially intrinsic oxide semiconductor film. In this way, changes in electric characteristics of a transistor including the oxide semiconductor film can be suppressed, and a highly reliable semiconductor device can be provided.

Note that in this specification and the like, in the case of the substantially purified oxide semiconductor film, the carrier density thereof is lower than $1\times10^{17}/cm^3$, lower than $1\times10^{15}/cm^3$, or lower than $1\times10^{13}/cm^3$. With a highly purified intrinsic oxide semiconductor film, the transistor can have stable electric characteristics.

The first oxide layer 401a is provided between the insulating layer 425 and the semiconductor layer 402.

The second oxide layer 401b is provided between the semiconductor layer 402 and the gate insulating layer 404. Specifically, the top surface of the second oxide layer 401b is in contact with the bottom surface of the gate insulating layer 404, and the bottom surface of the second oxide layer 401b is in contact with the top surfaces of the first electrode 403a and the second electrode 403b.

The first oxide layer 401a and the second oxide layer 401b each contain an oxide containing one or more metal elements that are also contained in the semiconductor layer 402.

Note that the boundary between the semiconductor layer 402 and the first oxide layer 401a or the boundary between the semiconductor layer 402 and the second oxide layer 401b is not clear in some cases.

For example, the first oxide layer 401a and the second oxide layer 401b contain In or Ga; typically, a material such as an In—Ga—O-based oxide, an In—Zn—O-based oxide, or an In-M-Zn—O-based oxide (M is a metal such as Al, Ti, Ga, Ge, Y, Zr, Sn, La, Ce, or Hf) that has an energy level of the conduction band minimum closer to the vacuum level than that of the semiconductor layer 402 is used. Typically, the difference between the energy of the conduction band minimum of the first oxide layer 401a or the second oxide layer 401b and the energy of the conduction band minimum of the semiconductor layer 402 is preferably 0.05 eV or higher, 0.07 eV or higher, 0.1 eV or higher, or 0.15 eV or higher and 2 eV or lower, 1 eV or lower, 0.5 eV or lower, or 0.4 eV or lower. Note that trap states caused by impurities or defects might be formed in the vicinity of the interface between an insulating film such as a silicon oxide film and each of the first oxide layer 401a and the second oxide layer 401b. The semiconductor layer 402 can be distanced away from the trap states owing to the existence of the first oxide layer 401a and the second oxide layer 401b. However, when the energy difference between the Ec of the first oxide layer 401a or the second oxide layer 401b and the Ec of the semiconductor layer 402 is small, electrons in the semiconductor layer 402 might reach the trap states across the energy difference. When the electrons are captured by the trap states, negative fixed charge is generated at the interface with the insulating layer, whereby the threshold voltage of the transistor shifts in the positive direction.

Thus, to reduce changes in the threshold voltage of the transistor, an energy difference between the Ec of the semiconductor layer 402 and the Ec of each of the first oxide layer 401a and the second oxide layer 401b is necessary. Each of the energy differences is preferably greater than or equal to 0.1 eV, further preferably greater than or equal to 0.15 eV.

The first oxide layer 401a, the semiconductor layer 402, and the second oxide layer 401b preferably include crystal parts. In particular, when crystals with c-axis alignment are used, the transistor can have stable electric characteristics.

For the semiconductor layer 402, an oxide having an electron affinity higher than those of the first oxide layer 401a and the second oxide layer 401b is used. For example, for the semiconductor layer 402, an oxide having an electron affinity higher than that of each of the first oxide layer 401a and the second oxide layer 401b by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy difference between the vacuum level and the conduction band minimum.

Here, it is preferable that the thickness of the semiconductor layer 402 be larger than at least that of the first oxide layer 401a. The thicker the semiconductor layer 402 is, the larger the on-state current of the transistor is. The thickness of the first oxide layer 401a may be set as appropriate as long as formation of an interface state at an interface with the semiconductor layer 402 is inhibited. For example, the thickness of the semiconductor layer 402 is larger than that of the first oxide layer 401a, preferably 2 times or more, further preferably 4 times or more, still further preferably 6 times or more as large as that of the first oxide layer 401a. Note that the above does not apply in the case where the on-state current of the transistor does not need to be increased, and the thickness of the first oxide layer 401a may be thicker than that of the semiconductor layer 402.

The thickness of the second oxide layer 401b may be set as appropriate, in a manner similar to that of the first oxide layer 401a, as long as generation of an interface state at an interface with the semiconductor layer 402 is inhibited. For example, the thickness of the second oxide layer 401b may be set smaller than or equal to that of the first oxide layer 401a. If the second oxide layer 401b is thick, it might become difficult for an electric field from the gate electrode 405 to reach the semiconductor layer 402. Therefore, it is preferable that the second oxide layer 401b be thin, for example, thinner than the semiconductor layer 402. Note that the thickness of the second oxide layer 401b is not limited to the above, and may be set as appropriate depending on driving voltage of the transistor in consideration of the withstand voltage of the gate insulating layer 404.

Here, in the case where the semiconductor layer 402 is in contact with an insulating layer containing different constituent elements (e.g., an insulating layer containing a silicon oxide film), an interface state is sometimes formed at the interface between the two layers and the interface state forms a channel. In this case, a second transistor having a different threshold voltage appears, so that an apparent threshold voltage of the transistor changes. In the transistor having the structure of this embodiment, however, the first oxide layer 401a containing one or more kinds of metal elements constituting the semiconductor layer 402 is provided, which makes it difficult for an interface state to be formed at the interface between the first oxide layer 401a and the semiconductor layer 402. Thus, providing the first oxide layer 401a makes it possible to reduce variations or changes in the electric characteristics of the transistor, such as threshold voltage.

When a channel is formed at the interface between the gate insulating layer 404 and the semiconductor layer 402, interface scattering occurs at the interface and the field-effect mobility of the transistor is reduced in some cases. In the transistor having the structure of this embodiment, however, since the second oxide layer 401b contains one or more kinds of metal elements constituting the semiconductor layer 402, scattering of carriers is less likely to occur at an interface between the semiconductor layer 402 and the second oxide layer 401b; thus, the field-effect mobility of the transistor can be increased.

One of the electrodes 403a and 403b serves as a source electrode and the other serves as a drain electrode.

The electrode 403a is electrically connected to the wiring 431 through the opening formed in the insulating layer 425 and the barrier layer 420. The electrode 403b is electrically connected to the wiring 433 through a similar opening.

(Embodiment 5)

In this embodiment, an example of a top-gate transistor is described.

Figure 7A:
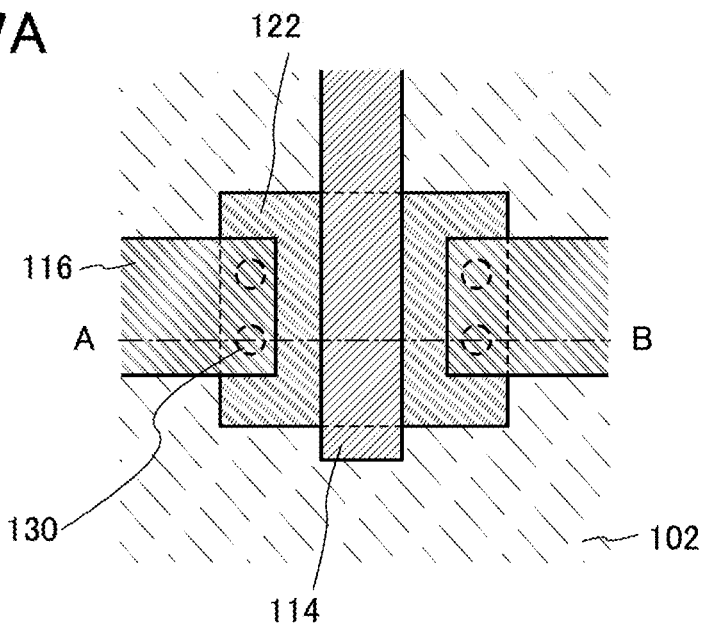
FIGS. 7A and 7B are a top view and a cross-sectional view illustrating a transistor of one embodiment of the present invention.
Figure 7B:
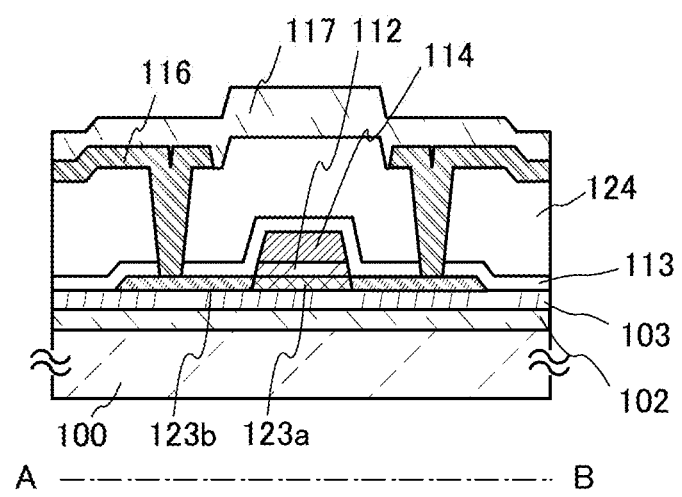

FIGS. 7A and 7B are a top view and a cross-sectional view of a top-gate transistor. FIG. 7A is a top view and FIG. 7B is a cross-sectional view taken along line A-B in FIG. 7A. Note that in FIG. 7A, some components of a transistor (e.g., the gate insulating film 112, the insulating film 113, and the interlayer insulating film 124) are omitted for simplicity.

The transistor illustrated in FIGS. 7A and 7B includes the substrate 100; the first aluminum oxide film 102 containing boron over the substrate 100; the oxygen-excess insulating layer 103 over the first aluminum oxide film 102 containing boron; a first oxide semiconductor film 123a and second oxide semiconductor films 123b in contact with the oxygen-excess insulating layer 103; the gate insulating film 112 over the first oxide semiconductor film 123a; the gate electrode 114 over the gate insulating film 112; the insulating film 113 covering the gate insulating film 112, the gate electrode 114, the first oxide semiconductor film 123a, and the second oxide semiconductor films 123b; the interlayer insulating film 124 covering the insulating film 113; the wirings 116 connected to the second oxide semiconductor films 123b through the contact holes 130 provided in the insulating film 113 and the interlayer insulating film 124; and the second aluminum oxide film 117 containing boron and covering the wirings 116.

There is no particular limitation on a substrate that can be used as the substrate 100 as long as it has at least heat resistance to withstand later heat treatment. For example, a glass substrate made of barium borosilicate glass, aluminoborosilicate glass, or the like can be used.

In the case where the temperature of heat treatment to be performed later is high, a glass substrate whose strain point is 730° C. or higher is preferably used. For the glass substrate, a glass material such as aluminosilicate glass, aluminoborosilicate glass, or barium borosilicate glass is used, for example. By containing a larger amount of barium oxide (BaO) than boron oxide, a more practical heat-resistant glass substrate is obtained. Therefore, a glass substrate containing a larger amount of BaO than $B_2O_3$ is preferably used.

Note that instead of the above glass substrate, a substrate formed using an insulator such as a ceramic substrate, a quartz substrate, a sapphire substrate, or the like may be used. Alternatively, crystallized glass or the like may be used.

The first aluminum oxide film 102 containing boron over the substrate 100 and the second aluminum oxide film 117 containing boron and covering the wirings 116 are formed in order to prevent hydrogen from diffusing into the first oxide semiconductor film 123a and the second oxide semiconductor films 123b. Note that it is not necessary to provide both the first aluminum oxide film 102 containing boron and the second aluminum oxide film 117 containing boron, and one of the first and second aluminum oxide films containing boron may be omitted.

In this embodiment, for the first aluminum oxide film 102 containing boron, a 50-nm-thick aluminum oxide film is formed by a sputtering method using an aluminum oxide target under the following conditions: an argon (Ar) gas at a flow rate of 25 sccm and an oxygen ($O_2$) gas at a flow rate of 25 sccm are used as deposition gases; the pressure is 0.4 Pa; the substrate temperature is 250° C.; the distance between the target and the substrate is 60 mm; and an RF power of 2.5 kW is applied. Then, boron ions are implanted into the aluminum oxide film with an acceleration voltage of 7 keV and a dose of $1\times10^{16}$ ions/cm$^2$. Thus, the first aluminum oxide film 102 containing boron can be formed.

Other than the method for implanting boron ions into an aluminum oxide film after film formation, the first aluminum oxide film 102 containing boron can be formed by a sputtering method using an aluminum oxide target into which boron ions are implanted.

The oxygen-excess insulating layer 103 over the first aluminum oxide film 102 containing boron is formed in order to supply oxygen to the first oxide semiconductor film 123a and the second oxide semiconductor films 123b in contact with the oxygen-excess insulating layer 103. Note that the oxygen-excess insulating layer 103 may be omitted. The oxygen-excess insulating layer 103 is preferably an oxide insulating layer, and more preferably contains oxygen in excess of the stoichiometric composition. For example, the oxygen-excess insulating layer may be formed in such a manner that film formation is performed under an oxygen atmosphere or oxygen is introduced to a deposited oxide insulating layer. As a method for introducing oxygen, an ion implantation method, an ion doping method, a plasma immersion ion implantation method, plasma treatment, or the like may be employed. The number of oxygen atoms can be measured by Rutherford backscattering spectrometry (RBS).

The first oxide semiconductor film 123a and the second oxide semiconductor films 123b are formed using a material containing two or more elements selected from In, Ga, Sn, and Zn. For example, the first oxide semiconductor film 123a and the second oxide semiconductor films 123b are formed using an In—Ga—Zn—O-based oxide semiconductor. An In—Ga—Zn—O-based non-single-crystal oxide semiconductor film can be obtained by a sputtering method using an oxide semiconductor target containing indium (In), gallium (Ga), and zinc (Zn). Alternatively, the first oxide semiconductor film 123a and the second oxide semiconductor films 123b can be formed by a chemical vapor deposition (CVD) method, an MBE method, a PLD method, an atomic layer deposition (ALD) method, or the like. In the case where an In—Ga—Zn—O oxide layer is formed by an MOCVD method, trimethylindium, trimethylgallium, dimethylzinc, and the like may be used as source gases. The combination of the source gases is not limited to the above: triethylindium or the like may be used instead of trimethylindium; triethylgallium or the like may be used instead of trimethylgallium; and diethylzinc or the like may be used instead of dimethylzinc. Etching or the like is performed after formation of the In—Ga—Zn—O-based non-single-crystal oxide semiconductor film, whereby the oxide semiconductor film having an island shape can be formed.

In the case where hydrogen is contained in the oxide semiconductor film, oxygen vacancies are formed in the film in some cases. Since the oxygen vacancies cause a change in the carrier density of an oxide semiconductor film, the electric characteristics of the oxide semiconductor film are changed. Heat treatment at a temperature higher than or equal to 400° C. and lower than or equal to the strain point of the substrate, preferably at a temperature higher than or equal to 400° C. and lower than or equal to 450° C. may be performed in order to reduce hydrogen in the oxide semiconductor film.

Although there is no particular limitation on the gate insulating film 112 over the first oxide semiconductor film 123a, at least a film not containing hydrogen much is preferable. It is also possible to use an aluminum oxide film containing boron as the gate insulating film 112.

The gate electrode 114 is formed by a sputtering method to have a thickness greater than or equal to 100 nm and less than or equal to 200 nm. The gate electrode 114 can be formed using an element selected from tantalum (Ta), tungsten (W), titanium (Ti), molybdenum (Mo), chromium (Cr), niobium (Nb), and the like, or an alloy material or a compound material which contains any of these elements as its main component. Moreover, a semiconductor material typified by polycrystalline silicon doped with an impurity element such as phosphorus can be used.

In this embodiment, the second oxide semiconductor films 123b can be formed in such a manner that the gate insulating film 112 and the gate electrode 114 are formed to have the shapes illustrated in FIG. 7B and then the island-shaped oxide semiconductor film is doped with argon (Ar) with an acceleration voltage of 10 keV and a dose of $1\times10^{15}$ ions/cm$^2$ with the use of the gate insulating film 112 and the gate electrode 114 as masks. Doping of Ar increases oxygen vacancies in the oxide semiconductor film and the carrier density of the film, whereby the resistance of the second oxide semiconductor films 123b can be lower than that of the first oxide semiconductor film 123a. Note that the carrier density of each of the second oxide semiconductor films 123b is preferably higher than or equal to $1\times10^{18}$/cm$^3$.

Any gas can be used for doping as long as the carrier density of the oxide semiconductor film can be increased, and a rare gas other than Ar, a gas containing hydrogen, boron, or phosphorus, or a mixture of these gases can be used.

The insulating film 113 may be formed to have a stacked-layer structure or a single-layer structure using, for example, silicon oxide, silicon oxynitride, silicon nitride oxide, silicon nitride, or the like. For example, the insulating film 113 may be formed by a thermal oxidation method, a CVD method, a sputtering method, or the like. The insulating film 113 is preferably formed using a silicon nitride film.

The interlayer insulating film 124 may be formed to have a stacked-layer structure or a single-layer structure using, for example, silicon oxide, silicon oxynitride, silicon nitride oxide, silicon nitride, or the like. For example, the interlayer insulating film 124 may be formed by a thermal oxidation method, a CVD method, a sputtering method, or the like. A silicon nitride film or a silicon nitride oxide film which does not contain hydrogen much is preferably used as the interlayer insulating film 124.

The wirings 116 can be formed using an element selected from aluminum, tungsten, titanium, tantalum, molybdenum, nickel, platinum, copper, gold, silver, manganese, neodymium, carbon, and silicon, or an alloy material or a compound material which contains any of these elements as its main component. Further, a stacked-layer structure of one or plural kinds of the above-described materials can be used. A wiring formed using copper containing manganese is known as a wiring formed using an alloy material which contains copper as its main component. Manganese in the copper wiring may be transferred to a portion where the wiring and the oxide semiconductor film are in contact with each other by heating after formation of the wiring so that an oxide of manganese is formed and that the reliability of the semiconductor device is increased. When a manganese layer or a titanium layer is formed between the oxide semiconductor film and the copper wiring in advance as an example of a stacked-layer structure, whereby the reliability of the semiconductor device can also be increased. As an alloy material containing aluminum as its main component, for example, a material which contains aluminum as its main component and also contains nickel, an alloy material which contains aluminum as its main component and also contains nickel and one or both of carbon and silicon, or the like can be used.

The second aluminum oxide film 117 containing boron can be formed in a manner similar to that of the first aluminum oxide film 102 containing boron. Note that it is not necessary to provide both the first aluminum oxide film 102 containing boron and the second aluminum oxide film 117 containing boron, and one of the aluminum oxide films containing boron may be omitted.

With the above-described structure, a transistor can have a large current value in an on state. A transistor with small current in an off state can be provided. A transistor having stable electric characteristics can be provided. A semiconductor device including the transistor can be provided. A robust semiconductor device can be provided. A novel semiconductor device can be provided.

(Embodiment 6)

A transistor having stable electric characteristics of one embodiment of the present invention can be applied to a variety of semiconductor devices such as a liquid crystal panel, a liquid crystal module, a liquid crystal display device, an EL panel, an EL module, an EL display device, a display device utilizing electronic ink or an electrophoretic element, an LSI, a memory, an RF tag, a CPU, and an electronic device.

<RF Tag>

An RF tag including the transistor or the memory device is described below with reference to FIG. 8.

The RF tag of one embodiment of the present invention includes a memory circuit, stores data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have high reliability in order to be used for this purpose.

A configuration of the RF tag will be described with reference to FIG. 8. FIG. 8 is a block diagram illustrating a configuration example of an RF tag.

Figure 8:
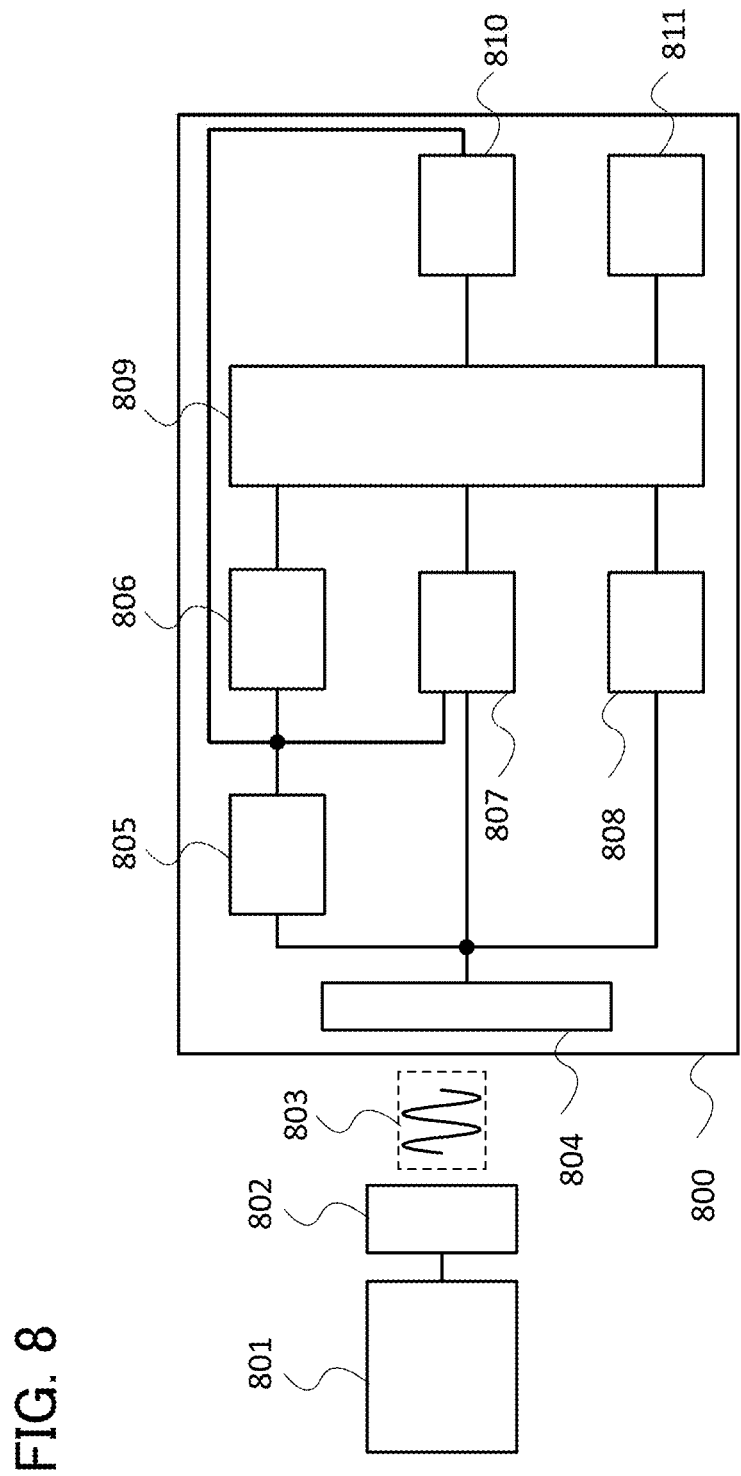
FIG. 8 is a block diagram of an RF tag of one embodiment of the present invention.
Figure 9A:
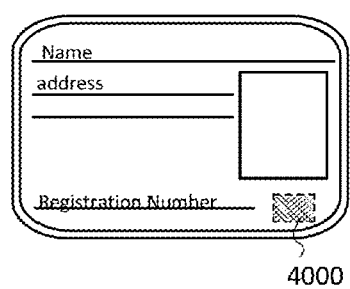
FIGS. 9A to 9F are views showing application examples of an RF tag of one embodiment of the present invention.
Figure 9B:
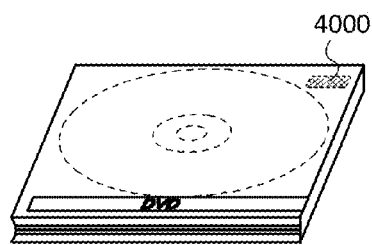
Figure 9C:
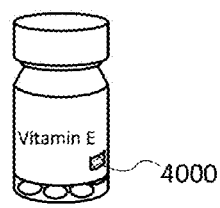
Figure 9D:
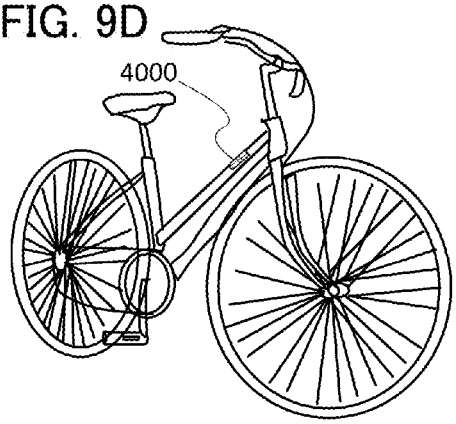
Figure 9E:
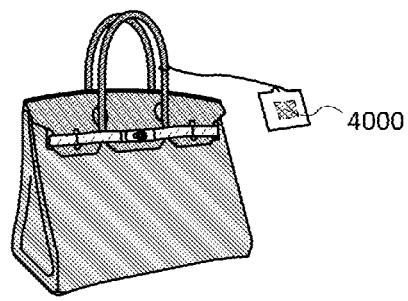
Figure 9F:
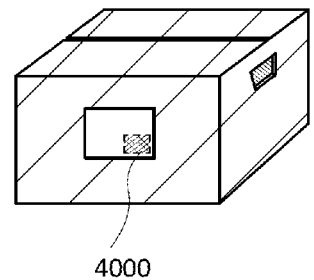

As shown in FIG. 8, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function and included in the demodulation circuit 807 may be a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that the decision whether each circuit described above is provided or not can be made as appropriate.

Here, the above-described memory device can be used as the memory circuit 810. Since the memory device of one embodiment of the present invention can retain data even when not powered, the memory device is suitable for an RF tag.

Furthermore, the memory device of one embodiment of the present invention needs power (voltage) needed for data writing lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

<Application Examples of RF Tag>

Application examples of the RF tag of one embodiment of the present invention are shown below with reference to FIGS. 9A to 9F. The RF tag is widely used and can be provided for, for example, products such as bills, coins, securities, bearer bonds, documents (e.g., driver's licenses or resident's cards, see FIG. 9A), packaging containers (e.g., wrapping paper or bottles, see FIG. 9C), recording media (e.g., DVDs or video tapes, see FIG. 9B), vehicles (e.g., bicycles, see FIG. 9D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 9E and 9F).

An RF tag 4000 of one embodiment of the present invention is fixed to products by being attached to a surface thereof or embedded therein. For example, the RF tag 4000 is fixed to each product by being embedded in paper of a book, or embedded in an organic resin of a package. The RF tag 4000 of one embodiment of the present invention is small, thin, and lightweight, so that the design of a product is not impaired even after the RF tag 4000 of one embodiment of the present invention is fixed thereto. Furthermore, bills, coins, securities, bearer bonds, documents, or the like can have identification functions by being provided with the RF tag 4000 of one embodiment of the present invention, and the identification functions can be utilized to prevent counterfeits. Moreover, the efficiency of a system such as an inspection system can be improved by providing the RF tag 4000 of one embodiment of the present invention for packaging containers, recording media, personal belongings, foods, clothing, household goods, electronic devices, or the like. Vehicles can also have higher security against theft or the like by being provided with the RF tag 4000 of one embodiment of the present invention.

As described above, the RF tag of one embodiment of the present invention can be used for the above-described purposes.

<CPU>

A CPU including a semiconductor device such as any of the above-described transistors or the above-described memory device is described below.

Figure 10:
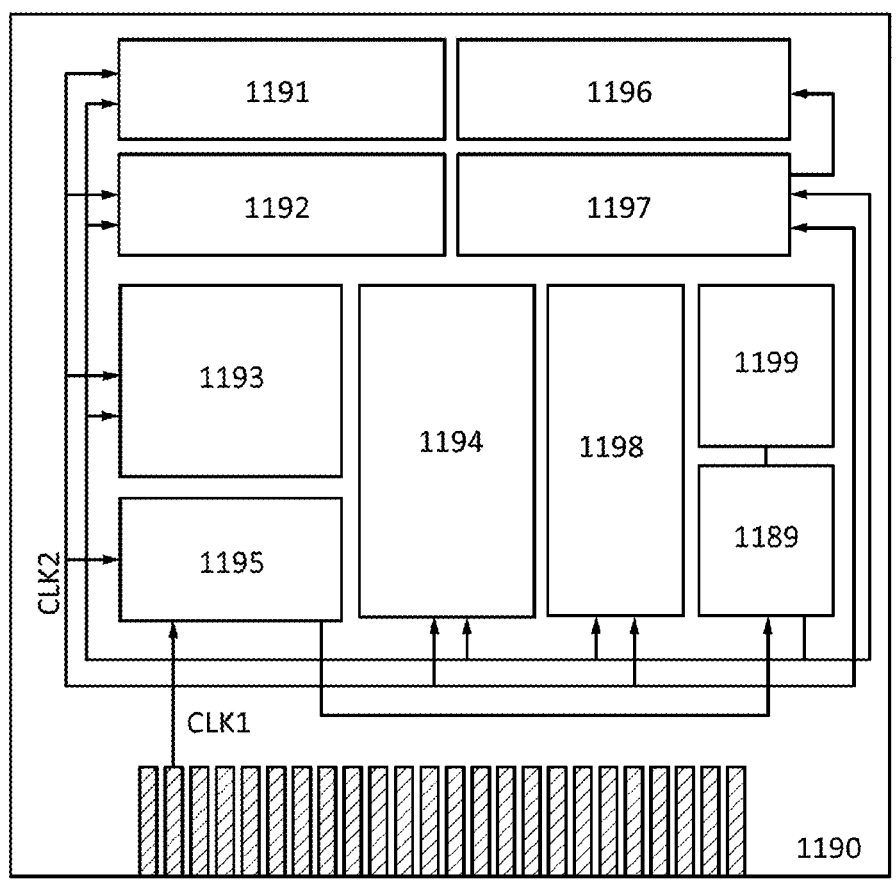
FIG. 10 is a block diagram illustrating a CPU of one embodiment of the present invention.

FIG. 10 is a block diagram illustrating a configuration example of a CPU including any of the above-described transistors as a component.

The CPU illustrated in FIG. 10 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F). A semiconductor substrate, an SOI substrate, a glass substrate, or the like is used as the substrate 1190. The ROM 1199 and the ROM interface 1189 may be provided over a separate chip. Needless to say, the CPU in FIG. 10 is just an example in which the configuration has been simplified, and an actual CPU may have a variety of configurations depending on the application. For example, the CPU may have the following configuration: a structure including the CPU illustrated in FIG. 10 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 10, a memory cell is provided in the register 1196. For the memory cell of the register 1196, any of the above-described transistors, the above-described memory device, or the like can be used.

In the CPU illustrated in FIG. 10, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 11:
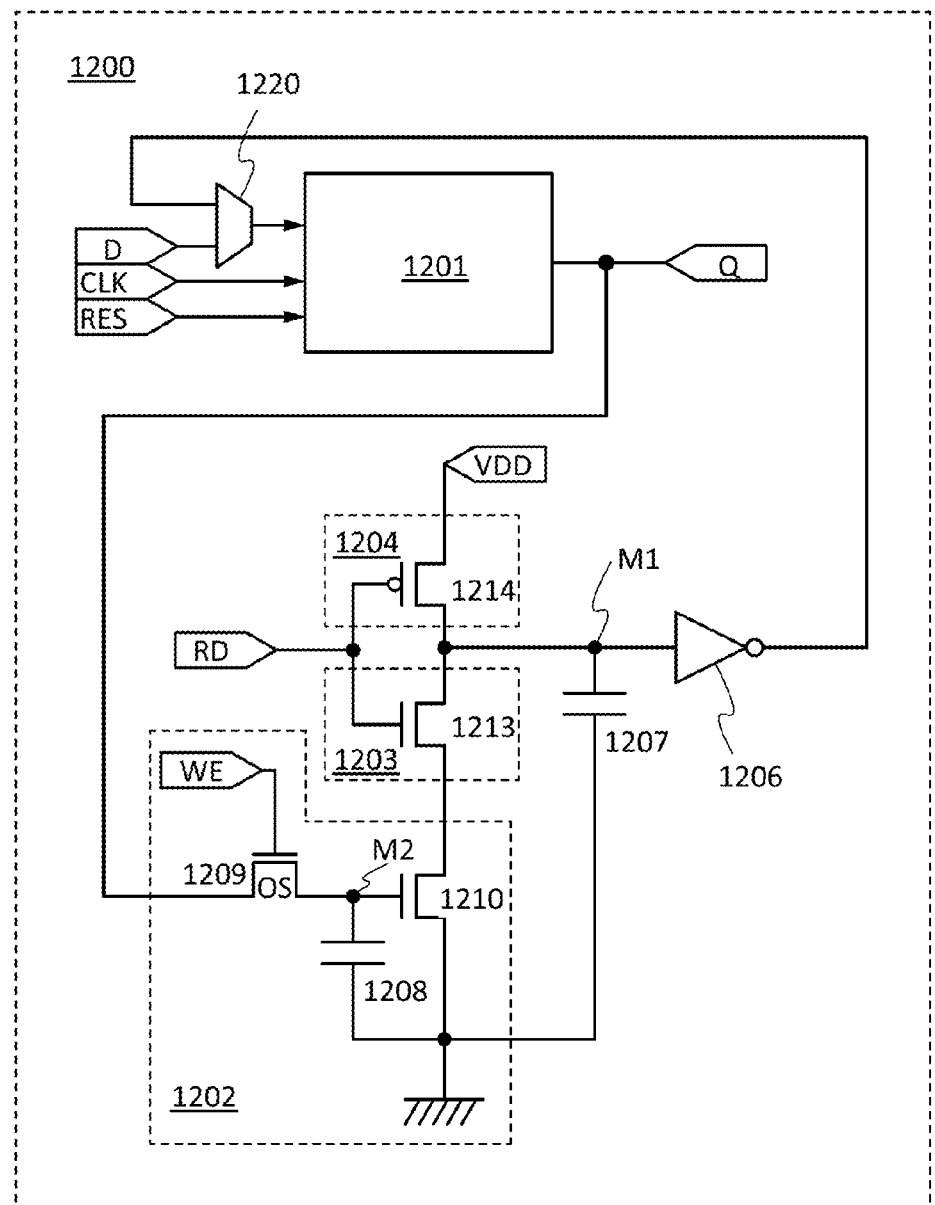
FIG. 11 is a circuit diagram of a memory element of one embodiment of the present invention.

FIG. 11 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate (gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 11 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 11, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 11, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor film. Further alternatively, in the memory element 1200, a transistor in which a channel is formed in an oxide semiconductor film can be included besides the transistor 1209, and a transistor in which a channel is formed in a layer or the substrate 1190 including a semiconductor other than an oxide semiconductor can be used for the rest of the transistors.

As the circuit 1201 in FIG. 11, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely small. For example, the off-state current of a transistor in which a channel is formed in an oxide semiconductor is significantly smaller than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency (RF) tag.

<Display Device>

The following shows configuration examples of a display device of one embodiment of the present invention.

[Configuration Example]

Figure 12A:
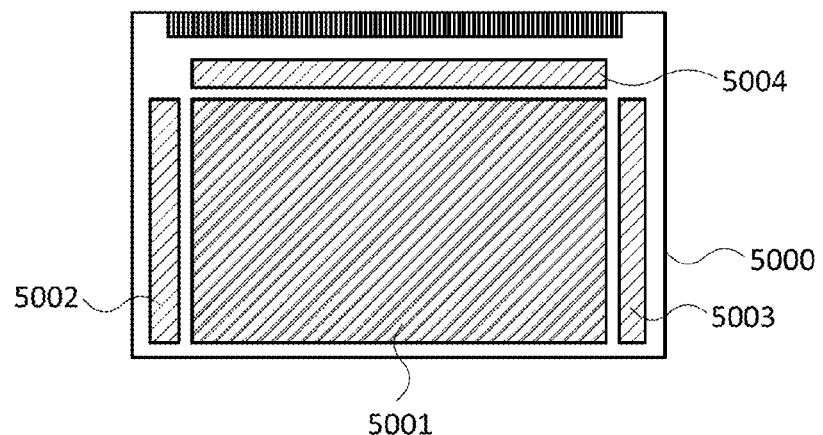
FIGS. 12A to 12C are a top view and circuit diagrams of a display device of one embodiment of the present invention.
Figure 12B:
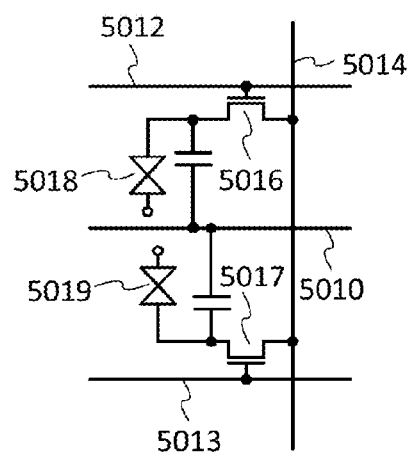
Figure 12C:
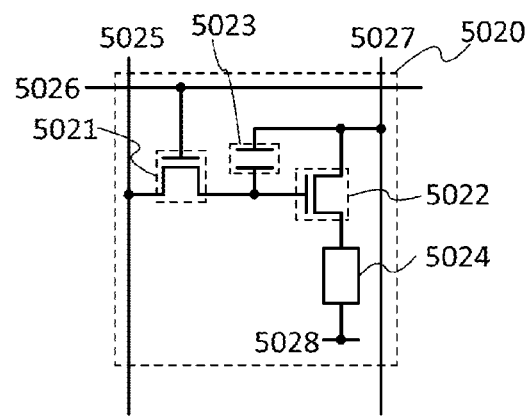

FIG. 12A is a top view of a display device of one embodiment of the present invention. FIG. 12B illustrates a pixel circuit where a liquid crystal element is used for a pixel of a display device of one embodiment of the present invention. FIG. 12C illustrates a pixel circuit where an organic EL element is used for a pixel of a display device of one embodiment of the present invention.

Any of the above-described transistors can be used as a transistor used for the pixel. Here, an example in which an n-channel transistor is used is shown. Note that a transistor manufactured through the same steps as the transistor used for the pixel may be used for a driver circuit. Thus, by using any of the above-described transistors for a pixel or a driver circuit, the display device can have high display quality and/or high reliability.

FIG. 12A illustrates an example of a top view of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, a display device can be manufactured at cost lower than that in the case where a driver circuit is separately formed. Furthermore, in the case where a driver circuit is separately formed, the number of wiring connections is increased. By providing the driver circuit over the substrate 5000, the number of wiring connections can be reduced. Accordingly, the reliability and/or yield can be improved.

[Liquid Crystal Display Device]

FIG. 12B illustrates an example of a circuit configuration of the pixel. Here, a pixel circuit which is applicable to a pixel of a VA liquid crystal display device, or the like is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 5012 of a transistor 5016 and a gate wiring 5013 of a transistor 5017 are separated so that different gate signals can be supplied thereto. In contrast, a source or drain electrode 5014 functioning as a data line is shared by the transistors 5016 and 5017. Any of the above-described transistors can be used as appropriate as each of the transistors 5016 and 5017. Thus, a liquid crystal display device having high display quality and/or high reliability can be provided.

The shapes of a first pixel electrode electrically connected to the transistor 5016 and a second pixel electrode electrically connected to the transistor 5017 are described. The first pixel electrode and the second pixel electrode are separated by a slit. The first pixel electrode has a V shape and the second pixel electrode is provided so as to surround the first pixel electrode.

A gate electrode of the transistor 5016 is electrically connected to the gate wiring 5012, and a gate electrode of the transistor 5017 is electrically connected to the gate wiring 5013. When different gate signals are supplied to the gate wiring 5012 and the gate wiring 5013, operation timings of the transistor 5016 and the transistor 5017 can be varied. As a result, alignment of liquid crystals can be controlled.

Furthermore, a capacitor may be formed using a capacitor wiring 5010, a gate insulating film functioning as a dielectric, and a capacitor electrode electrically connected to the first pixel electrode or the second pixel electrode.

The multi-domain pixel includes a first liquid crystal element 5018 and a second liquid crystal element 5019. The first liquid crystal element 5018 includes the first pixel electrode, a counter electrode, and a liquid crystal layer therebetween. The second liquid crystal element 5019 includes the second pixel electrode, a counter electrode, and a liquid crystal layer therebetween.

Note that a pixel circuit in the display device of one embodiment of the present invention is not limited to that shown in FIG. 12B. For example, a switch, a resistor, a capacitor, a transistor, a sensor, a logic circuit, or the like may be added to the pixel circuit shown in FIG. 12B.

[Organic EL Display Device]

FIG. 12C illustrates another example of a circuit configuration of the pixel. Here, a pixel structure of a display device using an organic EL element is shown.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 12C illustrates an example of a pixel circuit. Here, one pixel includes two n-channel transistors. Note that any of the above-described transistors can be used as the n-channel transistors. Furthermore, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, any of the above-described transistors can be used. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to a voltage which is the sum of power supply line voltage and the threshold voltage $V_{th}$ of the driver transistor 5022 is applied to the signal line 5025.

In the case of performing analog grayscale driving, a voltage higher than or equal to a voltage which is the sum of the forward voltage of the light-emitting element 5024 and the threshold voltage $V_{th}$ of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that shown in FIG. 12C. For example, a switch, a resistor, a capacitor, a sensor, a transistor, a logic circuit, or the like may be added to the pixel circuit shown in FIG. 12C.

In the case where any of the above-described transistors is used for the circuit shown in FIGS. 12A to 12C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device includes a display medium whose contrast, luminance, reflectivity, transmittance, or the like is changed by electric or magnetic action. The display element, the display device, the light-emitting element, or the light-emitting device comprises at least one element such as an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a display element using a micro electro mechanical system (MEMS), a digital micromirror device (DMD), a digital micro shutter (DMS), an interferometric modulator display (IMOD) element, an MEMS shutter display element, an optical interference type MEMS display element, an electrowetting element, a piezoelectric ceramic display, or a display element comprising a carbon nanotube. Examples of a display device including an EL element include an EL display. Examples of a display device including an electron emitter include a field emission display (FED), an SED-type flat panel display (SED: surface-conduction electron-emitter display), and the like. Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electro liquid powder, or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

A coloring layer (also referred to as a color filter) may be used in order to obtain a full-color display device in which white (W) light is used for a backlight (e.g., an organic EL element, an inorganic EL element, an LED, or a fluorescent lamp). As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

<Module>

A display module using a semiconductor device of one embodiment of the present invention is described below with reference to FIG. 13.

Figure 13:
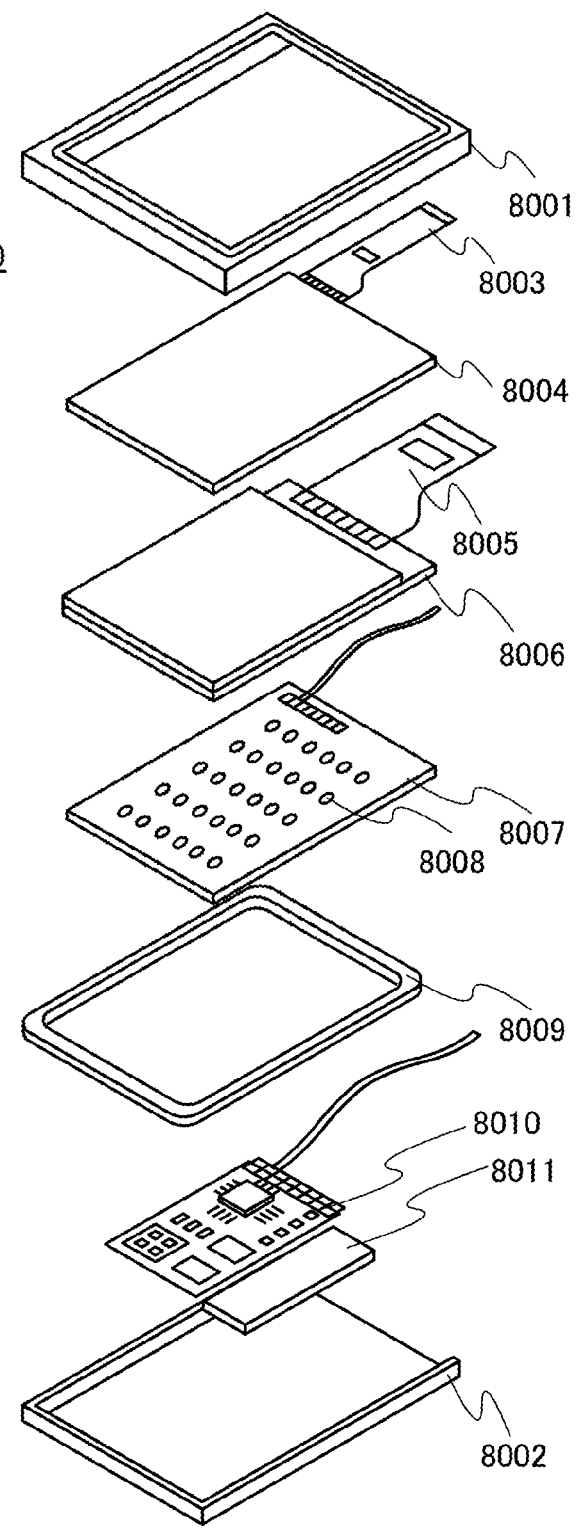
FIG. 13 illustrates a display module of one embodiment of the present invention.

In a display module 8000 in FIG. 13, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. A counter substrate (sealing substrate) of the display panel 8006 can have a touch panel function. A photosensor may be provided in each pixel of the display panel 8006 so that an optical touch panel is obtained. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 may protect the display panel 8006 and also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 14A to 14F illustrate specific examples of these electronic devices.

Figure 14A:
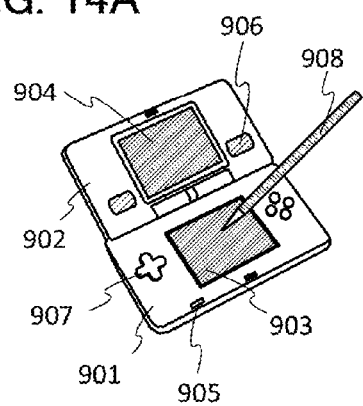
FIGS. 14A to 14F are views each illustrating an electronic device of one embodiment of the present invention.

FIG. 14A illustrates a portable game console including a housing 901, a housing 902, a display portion 903, a display portion 904, a microphone 905, speakers 906, an operation key 907, a stylus 908, and the like. Although the portable game console in FIG. 14A has the two display portions 903 and 904, the number of display portions included in a portable game console is not limited to this.

Figure 14B:
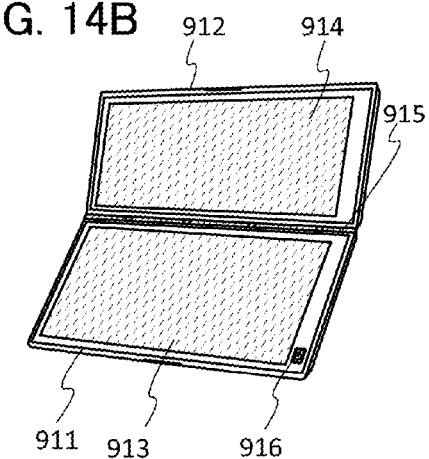

FIG. 14B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 14C:
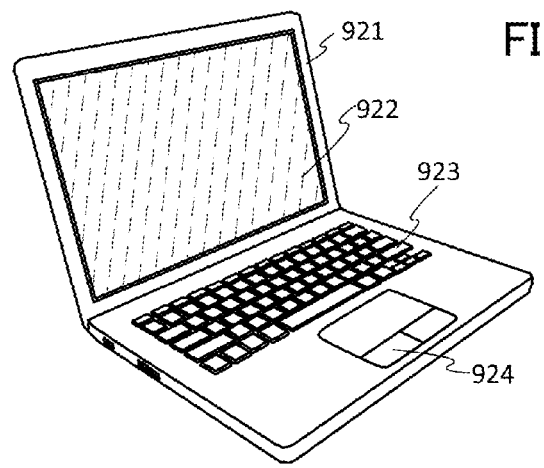

FIG. 14C illustrates a notebook personal computer including a housing 921, a display portion 922, a keyboard 923, a pointing device 924, and the like.

Figure 14D:
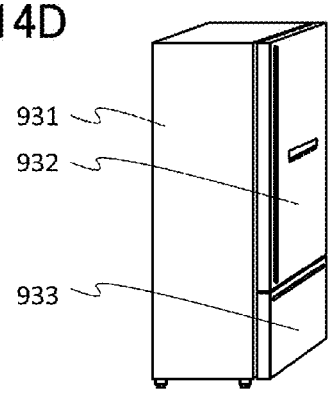

FIG. 14D illustrates an electric refrigerator-freezer including a housing 931, a door for a refrigerator 932, a door for a freezer 933, and the like.

Figure 14E:
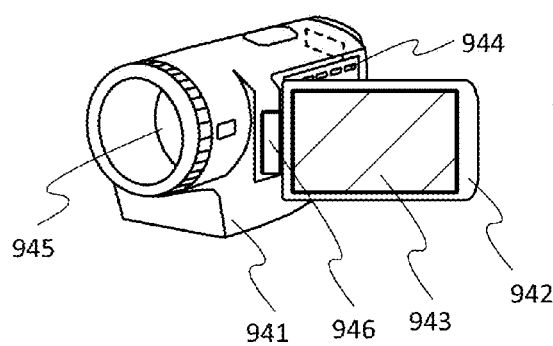

FIG. 14E illustrates a video camera including a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle between the first housing 941 and the second housing 942 at the joint 946.

Figure 14F:
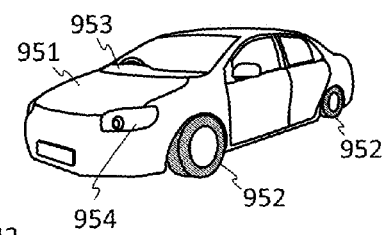

FIG. 14F illustrates an ordinary vehicle including a car body 951, wheels 952, a dashboard 953, lights 954, and the like.

[Example 1]

In this example, a sample including an aluminum oxide film containing boron of one embodiment of the present invention was formed and its property of preventing diffusion of hydrogen was examined. Here, a silicon oxynitride film was used as a hydrogen diffusion source.

The sample was formed in the following manner. A silicon oxynitride film was formed over a single crystal silicon substrate and an aluminum oxide film containing boron was formed over the silicon oxynitride film.

As the silicon oxynitride film, a 300-nm-thick silicon oxynitride film was formed using a parallel plate plasma CVD apparatus under the following conditions: as source gases, silane at a flow rate of 5 sccm and dinitrogen monoxide at a flow rate of 1000 sccm were supplied to a reaction chamber of the plasma CVD apparatus; the pressure in the reaction chamber was controlled to be 133.3 Pa; the distance between electrodes was 20 mm; and a power of 35 W was supplied with the use of a 13.56 MHz high-frequency power source. Note that the silicon oxynitride film was formed at a substrate temperature of 325° C.

Then, a 50-nm-thick aluminum oxide film was formed by a sputtering method using an aluminum oxide target under the following conditions: an argon (Ar) gas at a flow rate of 25 sccm and an oxygen ($O_2$) gas at a flow rate of 25 sccm were used as deposition gases; the pressure was 0.4 Pa; the substrate temperature was 250° C.; the distance between the target and the substrate was 60 mm; and an RF power of 2.5 kW was applied. Then, boron ions were implanted into the aluminum oxide film with an acceleration voltage of 7 keV and a dose of $1 \times 10^{16}$ ions/cm$^2$ by ion implantation, whereby the aluminum oxide film containing boron was formed.

Figure 5:
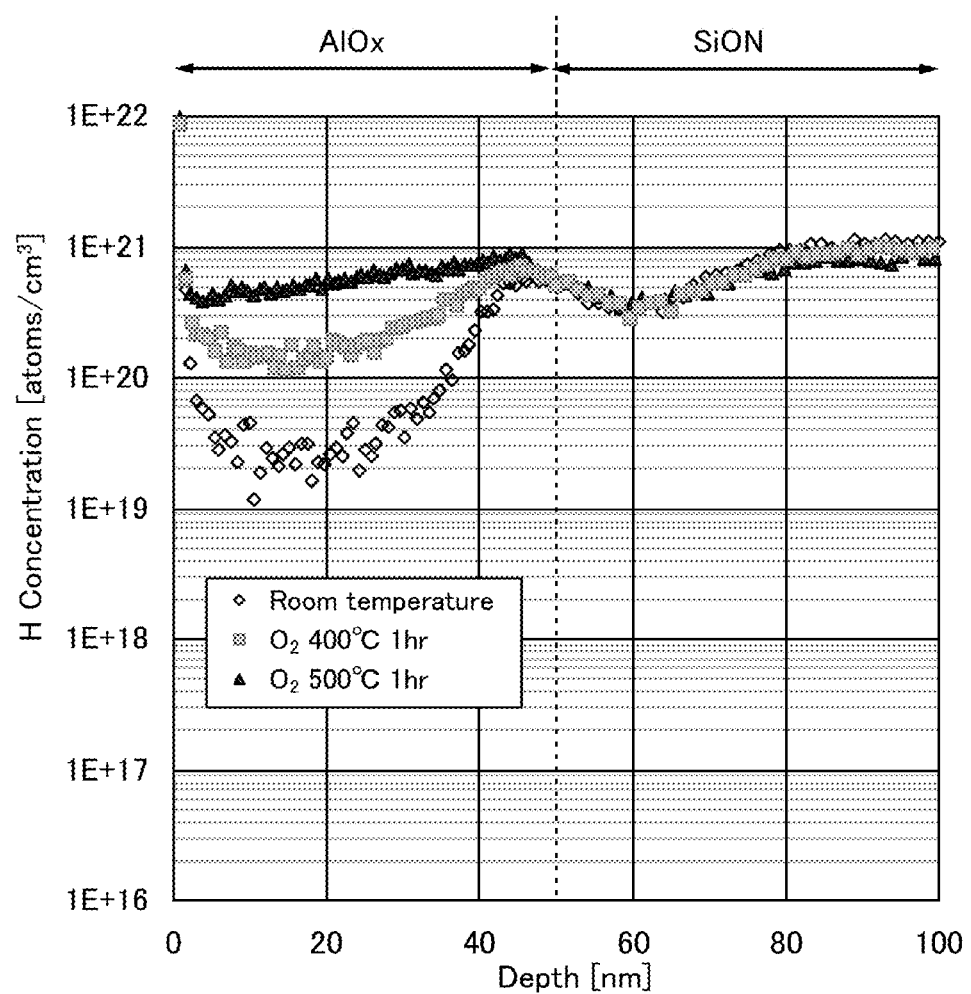
FIG. 5 shows the results of secondary ion mass spectrometry (SIMS) of one embodiment of the present invention.

An aluminum oxide film can prevent diffusion of hydrogen at room temperature even when it does not contain boron. In FIG. 5, the result of measuring hydrogen concentration of a sample at room temperature by secondary ion mass spectroscopy (SIMS) is shown. The sample was formed in such a manner that a silicon oxynitride film was formed over a single crystal silicon substrate and an aluminum oxide film was formed over the silicon oxynitride film. It is shown that the hydrogen concentration in the aluminum oxide film is not uniform; that is, the hydrogen concentration in the vicinity of the silicon oxynitride film is high and the hydrogen concentration in the middle of the aluminum oxide film is low. Accordingly, it can be said that the aluminum oxide film prevents diffusion of hydrogen contained in the silicon oxynitride film. Note that the values of the topmost surface of a sample and the vicinity of the interface of films are not referred to in SIMS generally because they might include errors.

In the case where hydrogen is contained in an oxide semiconductor film, oxygen vacancies are formed in the film in some cases. Since the oxygen vacancies cause a change in the carrier density of an oxide semiconductor film, the electric characteristics of the oxide semiconductor film are changed. Heat treatment at a temperature higher than or equal to 400° C. and lower than or equal to the strain point of a substrate, preferably higher than or equal to 400° C. and lower than or equal to 450° C. is performed in some cases to reduce hydrogen in the oxide semiconductor film. In the case of performing the heat treatment, a layer which can prevent hydrogen from diffusing from a layer containing hydrogen into the oxide semiconductor film is preferably provided.

FIG. 5 also shows the results of measuring hydrogen concentration of samples by SIMS. The samples were formed in such a manner that a silicon oxynitride film was formed over a single crystal silicon substrate, an aluminum oxide film was formed over the silicon oxynitride film, and heat treatment was performed for one hour under an oxygen atmosphere at 400° C. or 500° C. In the sample subjected to the heat treatment at 400° C. for one hour, the hydrogen concentration in the aluminum oxide film is less nonuniform than in the room-temperature sample, which means decrease in the capability of the aluminum oxide film to prevent diffusion of hydrogen contained in the silicon oxynitride film. In the sample subjected to the heat treatment at 500° C. for one hour, the hydrogen concentration in the aluminum oxide film is much less nonuniform, which means further decrease in the capability of the aluminum oxide film to prevent diffusion of hydrogen contained in the silicon oxynitride film. Accordingly, the possibility that hydrogen contained in a layer is diffused into the oxide semiconductor film might be increased when heat treatment at 400° C. or 500° C. is performed in order to reduce hydrogen in an oxide semiconductor film, although an aluminum oxide film is formed as a layer for preventing diffusion of hydrogen.

Figure 6:
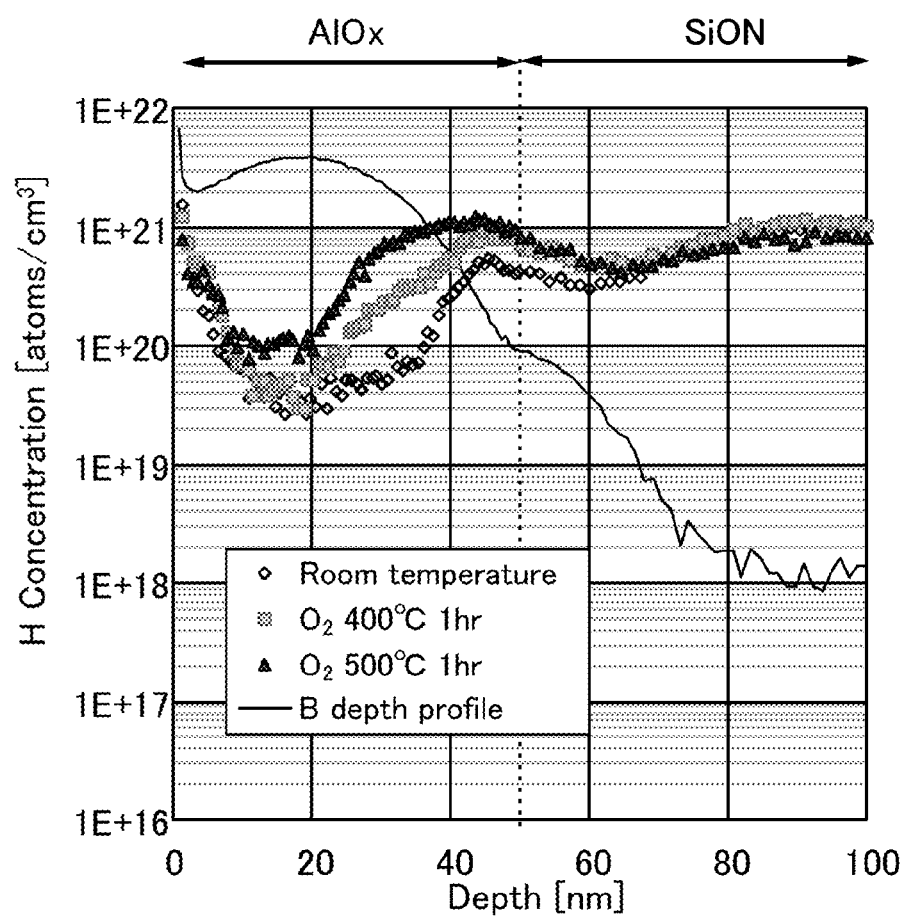
FIG. 6 shows the results of secondary ion mass spectrometry (SIMS) of one embodiment of the present invention.

FIG. 6 shows the results of measuring hydrogen concentration of samples subjected to heat treatment by SIMS. The samples were formed in such a manner that a silicon oxynitride film was formed over a single crystal silicon substrate, an aluminum oxide film containing boron was formed over the silicon oxynitride film, and heat treatment was performed for one hour under an oxygen atmosphere at 400° C. or 500° C. In addition, a depth profile of the boron concentration in the aluminum oxide film is shown in FIG. 6.

Note that in this example, the aluminum oxide film containing boron was formed in such a manner that boron ions were implanted into an aluminum oxide film with an acceleration voltage of 7 keV and a dose of $1\times10^{16}$ ions/cm$^2$. The maximum concentration of boron in the aluminum oxide film was higher than or equal to $1.0\times10^{21}$ atoms/cm$^3$ and lower than or equal to $1.0\times10^{22}$ atoms/cm$^3$. The concentration of boron in an aluminum oxide film is proportional to a dose when ion implantation is performed under the same condition other than the dose. Therefore, the concentration of boron can be set as appropriate by adjusting the dose depending on the purpose.

It is shown that the hydrogen concentration in the aluminum oxide film is not uniform; that is, the hydrogen concentration in the vicinity of the silicon oxynitride film is high and the hydrogen concentration in the middle of the aluminum oxide film is low. Accordingly, it can be said that the aluminum oxide film containing boron prevents diffusion of hydrogen contained in the silicon oxynitride film. From FIG. 6, diffusion of hydrogen contained in the silicon oxynitride film can be prevented when the aluminum oxide film has a thickness of at least approximately 30 nm. Note that an aluminum oxide film is preferably formed thin for later processing since etching of an aluminum oxide film is difficult as compared to other films in many cases, due to high resistance to a variety of etchants and difficulty in uniform etching. According to the above results, diffusion of hydrogen contained in a layer into an oxide semiconductor film can be prevented by an aluminum oxide film containing boron as a layer for preventing diffusion of hydrogen, even in the case where heat treatment at 400° C. or 500° C. is performed for reduction of hydrogen in the oxide semiconductor film.

[Example 2]

In this example, a sample including an aluminum oxide film containing boron of one embodiment of the present invention was formed and its dependence of a property of preventing diffusion of hydrogen on the amount of introduced boron was examined. Here, a silicon oxide film was used as a hydrogen diffusion source.

Samples 2-a, 2-b, and 2-c were formed in the following manner. A thermal oxide film, a silicon nitride film, and a silicon oxide film containing deuterium were formed over a single crystal silicon substrate, and an aluminum oxide film containing boron was formed over the silicon oxide film.

First, thermal oxidation was performed on the single crystal silicon substrate, so that a 100-nm-thick thermal oxide film was formed on a surface of the substrate. The thermal oxidation was performed at 950° C. for four hours in an atmosphere containing HCl at 3 volume % with respect to oxygen.

Next, a 50-nm-thick silicon nitride film was formed over the thermal oxide film by a plasma CVD method under the following conditions: silane at a flow rate of 20 sccm, dinitrogen monoxide at a flow rate of 500 sccm, and ammonia at a flow rate of 10 sccm were used as source gases; the pressure in a reaction chamber was 40 Pa; the substrate surface temperature was 350° C.; and a high frequency (RF) power of 10 W was applied.

Then, a 300-nm-thick silicon oxide film was formed over the silicon nitride film by a sputtering method under the following conditions: an argon (Ar) gas at a flow rate of 23.75 sccm, a deuterium (D$_2$) gas at a flow rate of 1.25 sccm, and an oxygen (O$_2$) gas at a flow rate of 25 sccm were used as deposition gases; the pressure was 0.4 Pa; the substrate temperature was 100° C.; the distance between the target and the substrate was 60 mm; and an RF power of 1.5 kW was applied. A sputtering target of silicon oxide was used for forming the silicon oxide film.

Then, a 50-nm-thick aluminum oxide film was formed by a sputtering method using an aluminum oxide target under the following conditions: an argon (Ar) gas at a flow rate of 25 sccm and an oxygen ($O_2$) gas at a flow rate of 25 sccm were used as deposition gases; the pressure was 0.4 Pa; the substrate temperature was 250° C.; the distance between the target and the substrate was 60 mm; and an RF power of 2.5 kW was applied. Then, boron ions were implanted into the aluminum oxide film, whereby the aluminum oxide film containing boron was formed.

In the sample 2-a, boron ions were implanted into the aluminum oxide film with an acceleration voltage of 7 keV and a dose of $1\times10^{16}$ ions/cm$^2$ by ion implantation, whereby the aluminum oxide film containing boron, which had a maximum boron concentration higher than or equal to $1.0\times10^{21}$ atoms/cm$^3$ and lower than or equal to $1.0\times10^{22}$ atoms/cm$^3$, was formed. In the sample 2-b, boron ions were implanted into the aluminum oxide film with an acceleration voltage of 7 keV and a dose of $5\times10^{15}$ ions/cm$^2$, whereby the aluminum oxide film containing boron, which had a maximum boron concentration higher than or equal to $5.0\times10^{20}$ atoms/cm$^3$ and lower than or equal to $5.0\times10^{21}$ atoms/cm$^3$, was formed. In the sample 2-c, boron implantation was not performed.

In the case where hydrogen is contained in an oxide semiconductor film, oxygen vacancies are formed in the film in some cases. Since the oxygen vacancies cause a change in the carrier density of an oxide semiconductor film, the electric characteristics of the oxide semiconductor film are changed. Heat treatment at a temperature higher than or equal to 400° C. and lower than or equal to the strain point of a substrate, preferably higher than or equal to 400° C. and lower than or equal to 450° C. is performed in some cases to reduce hydrogen in the oxide semiconductor film. In the case of performing the heat treatment, a layer which can prevent hydrogen from diffusing from a layer containing hydrogen into the oxide semiconductor film is preferably provided.

Figure 15:
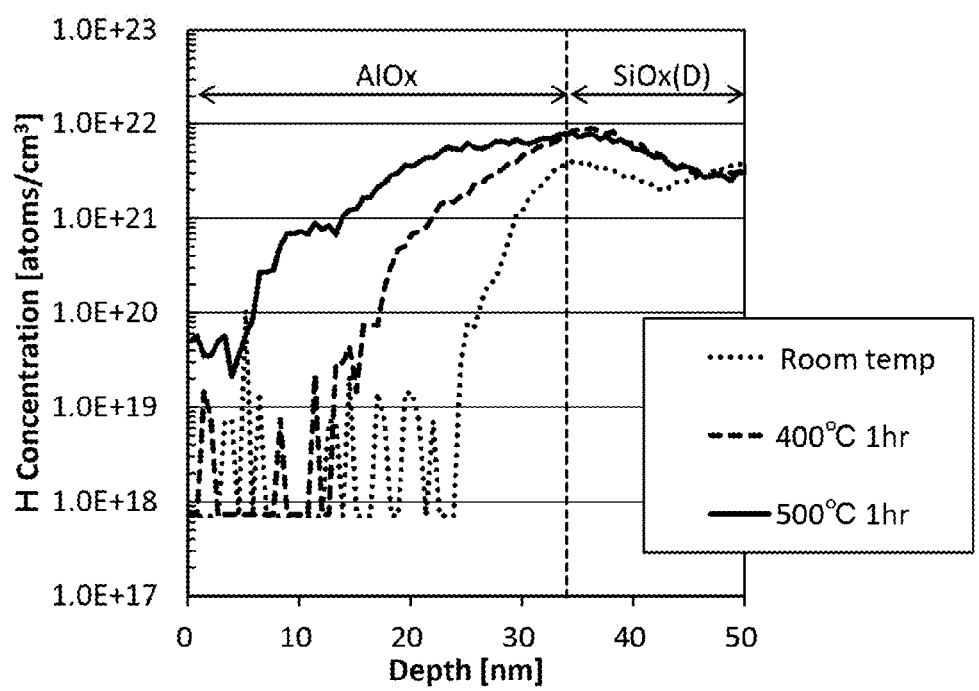
FIG. 15 shows the results of secondary ion mass spectrometry (SIMS) of one embodiment of the present invention.
Figure 16:
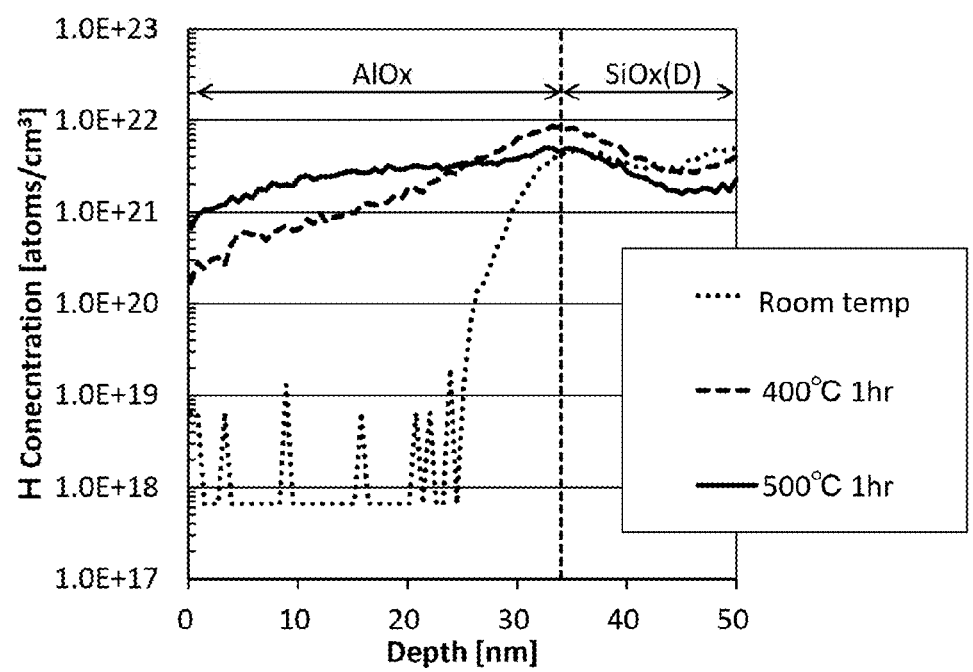
FIG. 16 shows the results of secondary ion mass spectrometry (SIMS) of one embodiment of the present invention.
Figure 17:
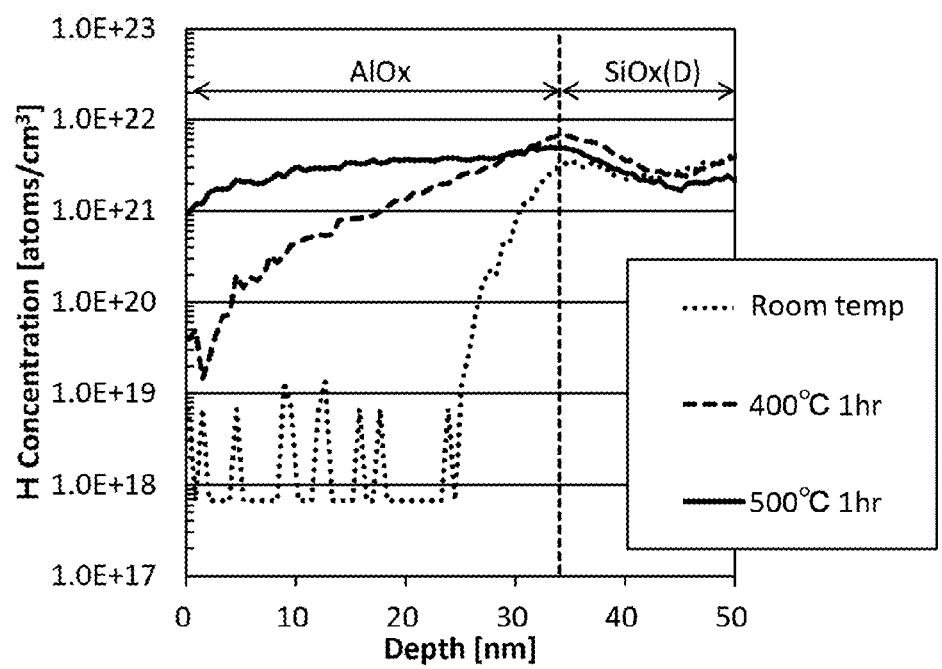
FIG. 17 shows the results of secondary ion mass spectrometry (SIMS) of one embodiment of the present invention.

In view of the above, the deuterium concentrations of the samples after heat treatment at 400° C. for one hour in an oxygen atmosphere, after heat treatment at 500° C. for one hour in an oxygen atmosphere, and at room temperature were measured. FIG. 15, FIG. 16, and FIG. 17 show the results. Note that FIG. 15 shows the results of the sample 2-a, FIG. 16 the sample 2-b, and FIG. 17 the sample 2-c. The measurement was performed by SIMS.

An aluminum oxide film can prevent diffusion of hydrogen at room temperature even when it does not contain boron. FIG. 17 shows that the deuterium concentration in the aluminum oxide film decreases as the distance from the silicon oxide film increases. Accordingly, it can be said that the aluminum oxide film prevents diffusion of hydrogen contained in the silicon oxynitride film.

On comparison of FIG. 15, FIG. 16, and FIG. 17, the aluminum oxide film of the sample 2-a prevents diffusion of hydrogen the most, while there is little difference between the aluminum oxide film of the sample 2-b and the aluminum oxide film of the sample 2-c. That is, in the case where boron is introduced to an aluminum oxide film serving as a layer for preventing diffusion of hydrogen, the maximum concentration of boron is higher than or equal to $5.0\times10^{20}$ atoms/cm$^3$, preferably higher than or equal to $1.0\times10^{21}$ atoms/cm$^3$ and lower than or equal to $1.0\times10^{22}$ atoms/cm$^3$, whereby hydrogen contained in a layer can be efficiently prevented from diffusing into an oxide semiconductor film.

This application is based on Japanese Patent Application serial no. 2013-269698 filed with Japan Patent Office on Dec. 26, 2013, the entire contents of which are hereby incorporated by reference.

What is claimed is:

1. A semiconductor device comprising:
   a first aluminum oxide film over a substrate;
   a transistor over the first aluminum oxide film, the transistor comprising:
      a gate electrode;
      an oxide semiconductor film comprising a channel formation region; and
      a gate insulating film between the gate electrode and the oxide semiconductor film; and
   a second aluminum oxide film over the transistor,
   wherein the first aluminum oxide film, the transistor, and the second aluminum oxide film overlap each other, and
   wherein each of the first aluminum oxide film and the second aluminum oxide film contains boron.

2. The semiconductor device according to claim 1, wherein a thickness of each of the first aluminum oxide film and the second aluminum oxide film is greater than or equal to 30 nm and less than or equal to 50 nm.

3. The semiconductor device according to claim 1, further comprising an oxygen-excess insulating layer being in contact with the oxide semiconductor film.

4. The semiconductor device according to claim 1, further comprising an oxygen-excess insulating layer being in contact with the oxide semiconductor film,
   wherein the oxygen-excess insulating layer contains oxygen at a ratio exceeding a ratio of oxygen in a stoichiometric composition of the oxygen-excess insulating layer.

5. The semiconductor device according to claim 1, further comprising a source electrode and a drain electrode which are electrically connected to the oxide semiconductor film.

6. A semiconductor device comprising:
   a first aluminum oxide film over a substrate;
   a transistor over the first aluminum oxide film, the transistor comprising:
      a gate electrode;
      an oxide semiconductor film comprising a channel formation region; and
      a gate insulating film between the gate electrode and the oxide semiconductor film; and
   a second aluminum oxide film over the transistor,
   wherein the first aluminum oxide film, the transistor, and the second aluminum oxide film overlap each other,
   wherein each of the first aluminum oxide film and the second aluminum oxide film contains boron, and
   wherein a maximum concentration of boron in each of first aluminum oxide film and the second aluminum oxide film is higher than or equal to $5.0\times10^{20}$ atoms/cm$^3$ and lower than or equal to $1.0\times10^{22}$ atoms/cm$^3$.

7. The semiconductor device according to claim 6, wherein a thickness of each of the first aluminum oxide film and the second aluminum oxide film is greater than or equal to 30 nm and less than or equal to 50 nm.

8. The semiconductor device according to claim 6, further comprising an oxygen-excess insulating layer being in contact with the oxide semiconductor film.

9. The semiconductor device according to claim 6, further comprising an oxygen-excess insulating layer being in contact with the oxide semiconductor film, wherein the oxygen-excess insulating layer contains oxygen at a ratio exceeding a ratio of oxygen in a stoichiometric composition of the oxygen-excess insulating layer.

10. The semiconductor device according to claim 6, further comprising a source electrode and a drain electrode which are electrically connected to the oxide semiconductor film.

11. A semiconductor device comprising:
a first transistor, a channel formation region of the first transistor comprising crystalline silicon;
a first aluminum oxide film over the first transistor;
a second transistor over the first aluminum oxide film, the second transistor comprising:
a gate electrode;
an oxide semiconductor film comprising a channel formation region; and
a gate insulating film between the gate electrode and the oxide semiconductor film; and
a second aluminum oxide film over the second transistor,
wherein the first aluminum oxide film, the second transistor, and the second aluminum oxide film overlap each other, and
wherein each of the first aluminum oxide film and the second aluminum oxide film contains boron.

12. The semiconductor device according to claim 11, wherein a thickness of each of the first aluminum oxide film and the second aluminum oxide film is greater than or equal to 30 nm and less than or equal to 50 nm.

13. The semiconductor device according to claim 11, further comprising an oxygen-excess insulating layer being in contact with the oxide semiconductor film.

14. The semiconductor device according to claim 11, further comprising an oxygen-excess insulating layer being in contact with the oxide semiconductor film,
wherein the oxygen-excess insulating layer contains oxygen at a ratio exceeding a ratio of oxygen in a stoichiometric composition of the oxygen-excess insulating layer.

15. The semiconductor device according to claim 11, further comprising a source electrode and a drain electrode which are electrically connected to the oxide semiconductor film.

16. The semiconductor device according to claim 11, wherein a maximum concentration of boron in each of first aluminum oxide film and the second aluminum oxide film is higher than or equal to $5.0 \times 10^{20}$ atoms/cm$^3$ and lower than or equal to $1.0 \times 10^{22}$ atoms/cm$^3$.

* * * * *